United States Patent
Fischer et al.

(10) Patent No.: US 6,372,536 B1
(45) Date of Patent: Apr. 16, 2002

(54) II-VI SEMICONDUCTOR COMPONENT HAVING AT LEAST ONE JUNCTION BETWEEN A LAYER CONTAINING SE AND A LAYER CONTAINING BETE, AND PROCESS FOR PRODUCING THE JUNCTION

(75) Inventors: Frank Fischer; Andreas Waag, both of Würzburg; Thierry Baron, Gerbrunn; Gottfried Landwehr, Würzburg; Thomas Litz, Würzburg; Günter Reuscher, Würzburg; Markus Keim, Ansbach; Ulrich Zehnder, Würzburg; Hans-Peter Steinbrück, Erlangen; Mario Nagelstrasser, Würzburg; Hans-Jürgen Lugauer, Gerbrunn, all of (DE)

(73) Assignee: Osram Opto Semiconductors & Co. OHG, Regensberg (DE)

( * ) Notice: Subject to any disclaimer, the term of this patent is extended or adjusted under 35 U.S.C. 154(b) by 0 days.

(21) Appl. No.: 09/480,756

(22) Filed: Jan. 10, 2000

Related U.S. Application Data

(63) Continuation of application No. PCT/DE98/01913, filed on Jul. 9, 1998.

(30) Foreign Application Priority Data

Jul. 9, 1997 (DE) .......................... 197 29 396

(51) Int. Cl.$^7$ ...................... H01L 21/00; H01L 31/0256
(52) U.S. Cl. ........................... 438/46; 257/78
(58) Field of Search ............... 438/46, 47, 493, 438/503, 507, 602, 603; 372/43, 44; 257/78, 94, 96, 97, 103

(56) References Cited

U.S. PATENT DOCUMENTS 5,422,902 A * 6/1995 Mensz .......................... 372/43

FOREIGN PATENT DOCUMENTS

| DE | 195 42 241 A1 | 5/1997 |
| EP | 0 632 504 A2 | 1/1995 |

OTHER PUBLICATIONS

Gossman, H.J. et al., "Delta doping in Silicon", Critical Reviews in Solid State and Materials Sciences, 18(1), pp. 1–67 (no month given), 1993.*
Chen, W. et al., "Reduction of the Au/p–ZnSe (100) Schottky barrier height using a thin Se interlayer", J. Crystal Growth 138, No. 1/4, p. 1078, Apr. 1994.*
International Publication WO 94/15369 (Gunshor et al.). dated Jul. 7, 1994.
Japanese Patent Abstract No. 07135339 (Akira), dated May 23, 1995.
W. Chen et al.: "Reduction of the Au/p–ZnSe(100) Schottky barrier height using a thin SE interlayer", Journal of Crystal Growth 138 (1994) p. 1078.
Y. Lansari et al.: "Improved ohmic contacts for p–type ZnSe and related p–on–n diode", Appl. Phys. Lett., vol. 61, No. 21, Nov. 23, 1992, pp. 2554–2556.
J. Qui et al.: "Recent developments in the MBE growth of wide bandgap II–IV semiconductors for laser diodes and LEDs", Journal of Crystal Growth 127 (1993), pp. 279–286.
R.G. Dandrea et al.: "Interfacial atomic structure and band offsets at semiconductor heterojunction", J. Vac. Sci. Technol. B, vol. 10, No. 4, Jul./Aug. 1992, pp. 1744–1753.
F. Capasso et al.: "Tunable barrier heights and band discontinuities via doping interface dipoles: An interface engineering technique and its device applications", J. Vac. Sci. Technol. B 3 (4), Jul./Aug. 1985, pp. 1245–1251.
P.M. Mensz: "BeTe/ZnSe graded band gap ohmic contacts to p–ZnSe", Appl. Phys. Lett. 64 (16) Apr. 18, 1994, pp. 2148–2150.
Y. Fan et al.: "Graded band gap ohmic contact to p–ZnSe", Appl. Phys. Lett. 61 (26), Dec. 28, 1992, pp. 3160–3162.
H.–J. Gossmann et al.: "Delta Doping in Silicon", Critical Reviews in Solid State and Material Sciences, 18(1): pp. 1–67 (1993).

* cited by examiner

Primary Examiner—Keith Christianson
(74) Attorney, Agent, or Firm—Herbert L. Lerner; Laurence A. Greenberg; Werner H. Stemer

(57) ABSTRACT

The invention relates to a II-VI semiconductor component in which, within a series of layers, there is provided at least one junction between a semiconductor layer containing BeTe and a semiconductor layer containing Se. A boundary layer between the semiconductor layer containing BeTe and the semiconductor layer containing Se is prepared in such a way that it forms a Be—Se configuration.

17 Claims, 15 Drawing Sheets

○ Zn  ● Se  ∘ Be  ⊘ Te

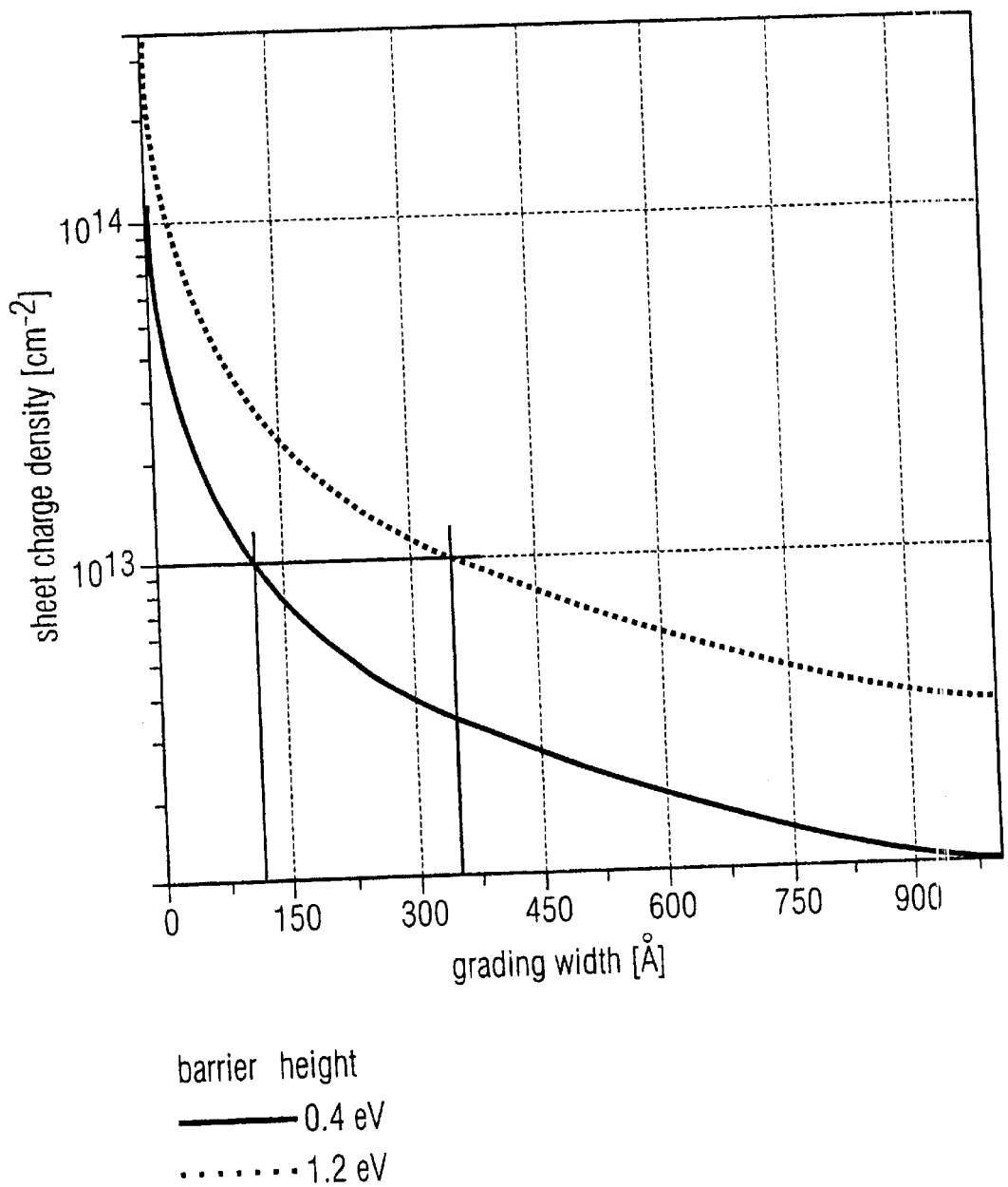

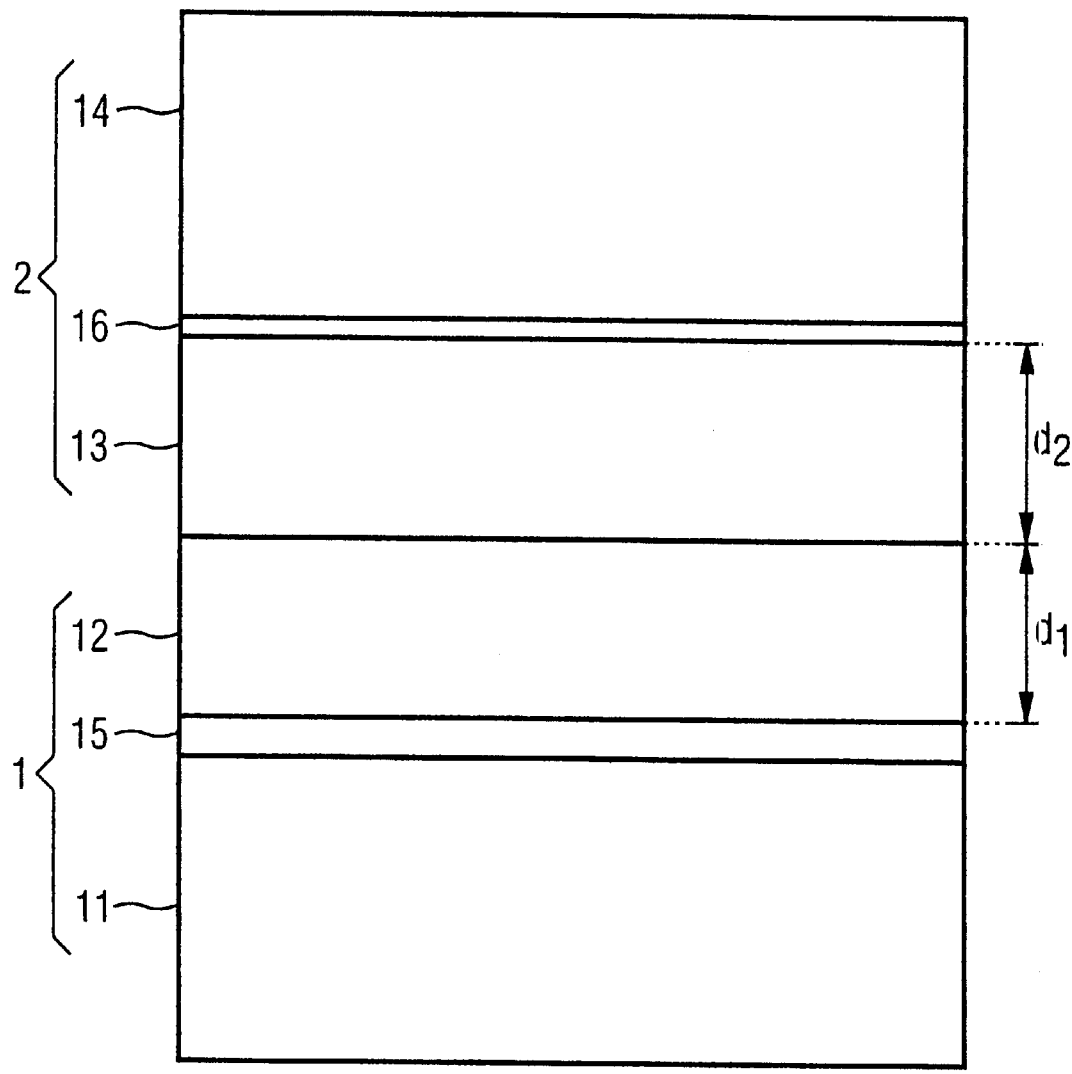

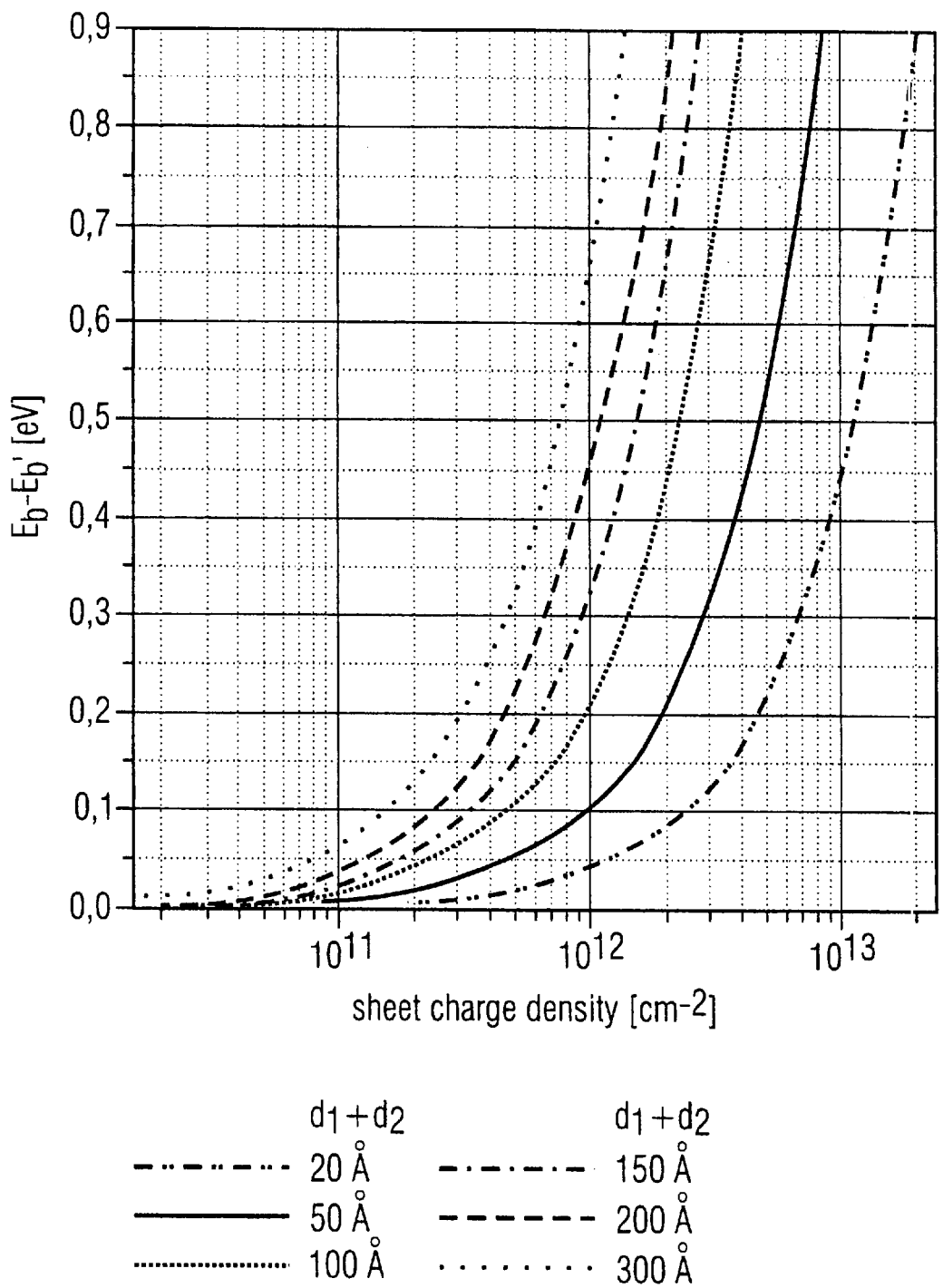

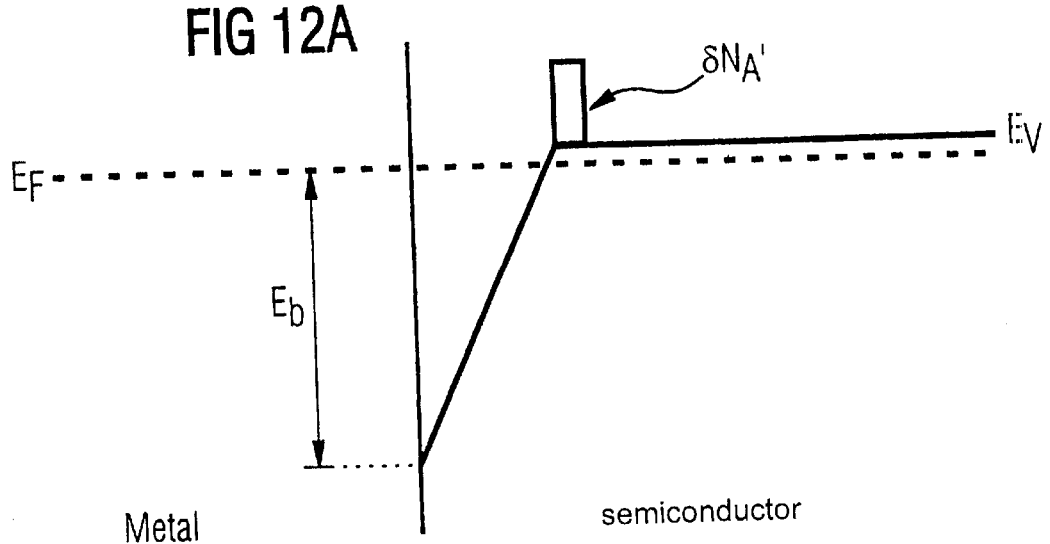
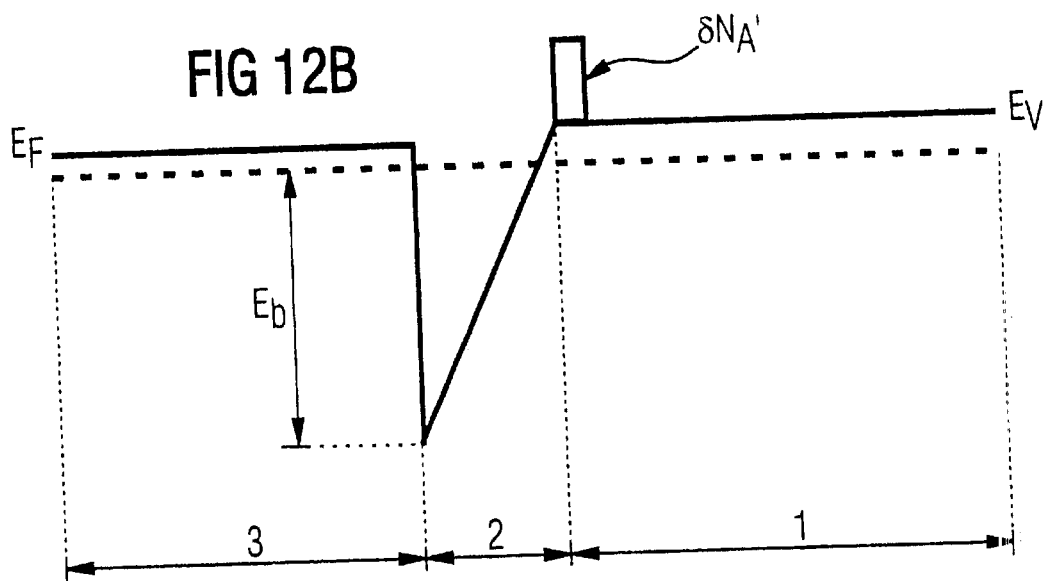

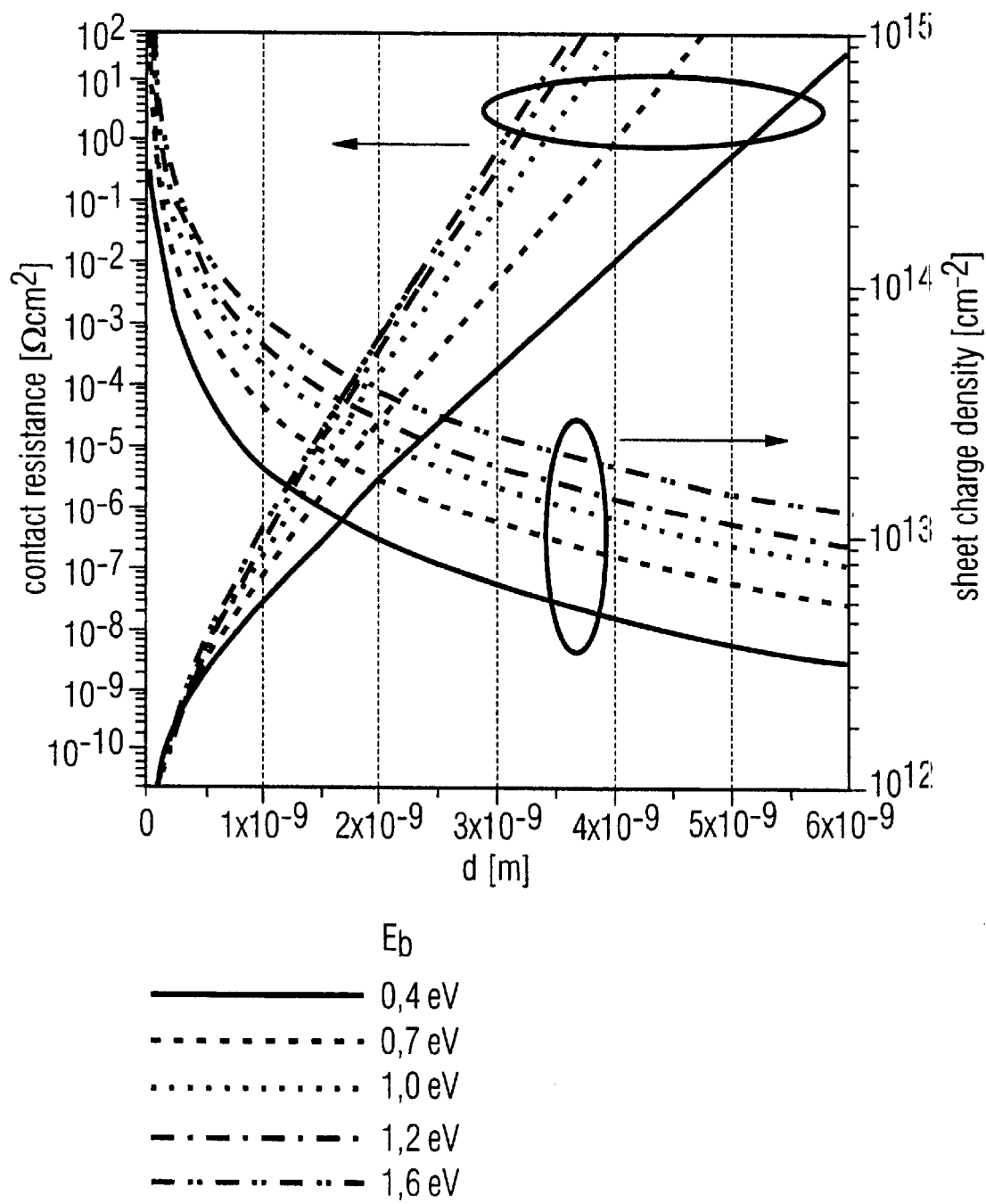

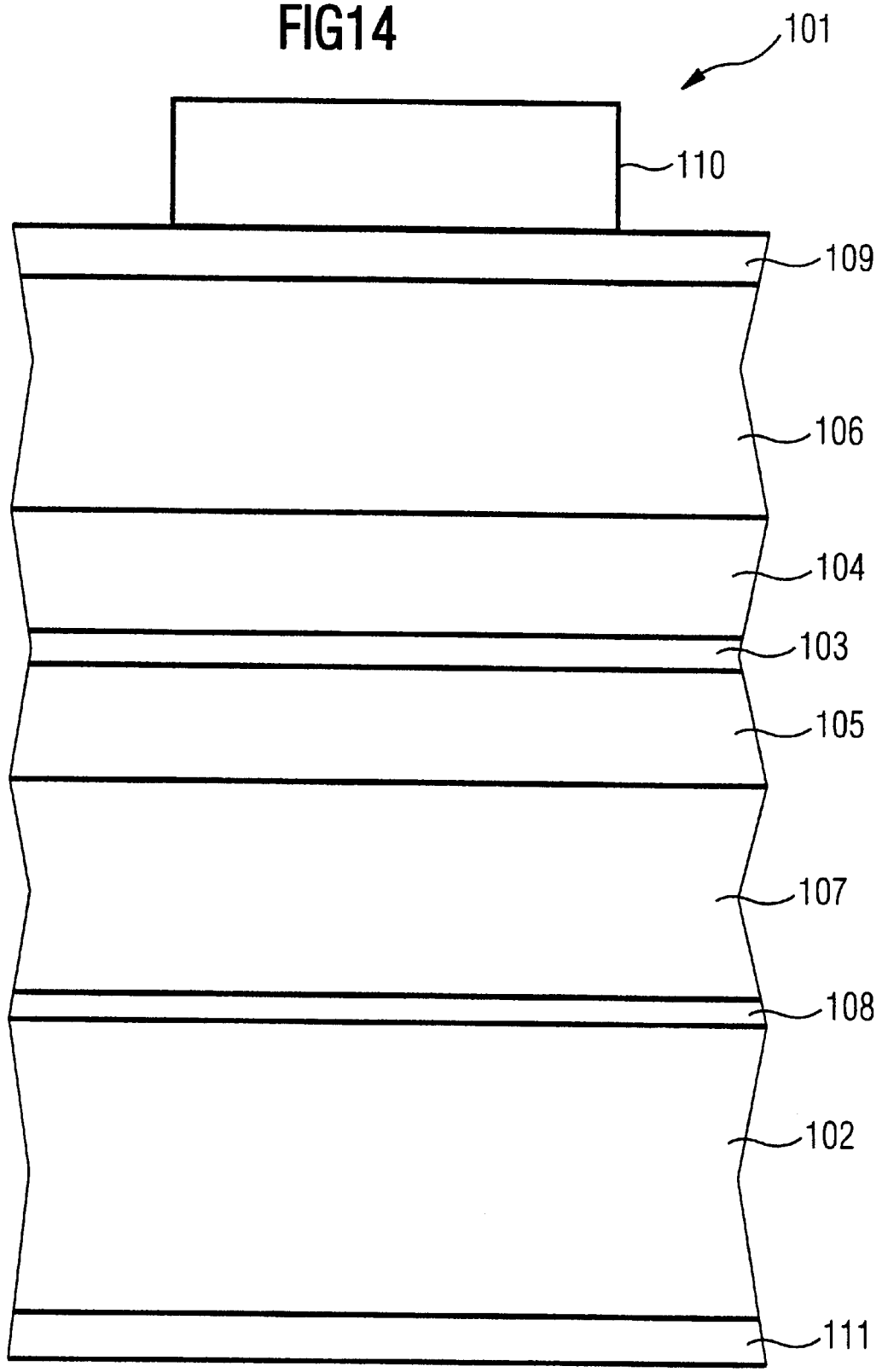

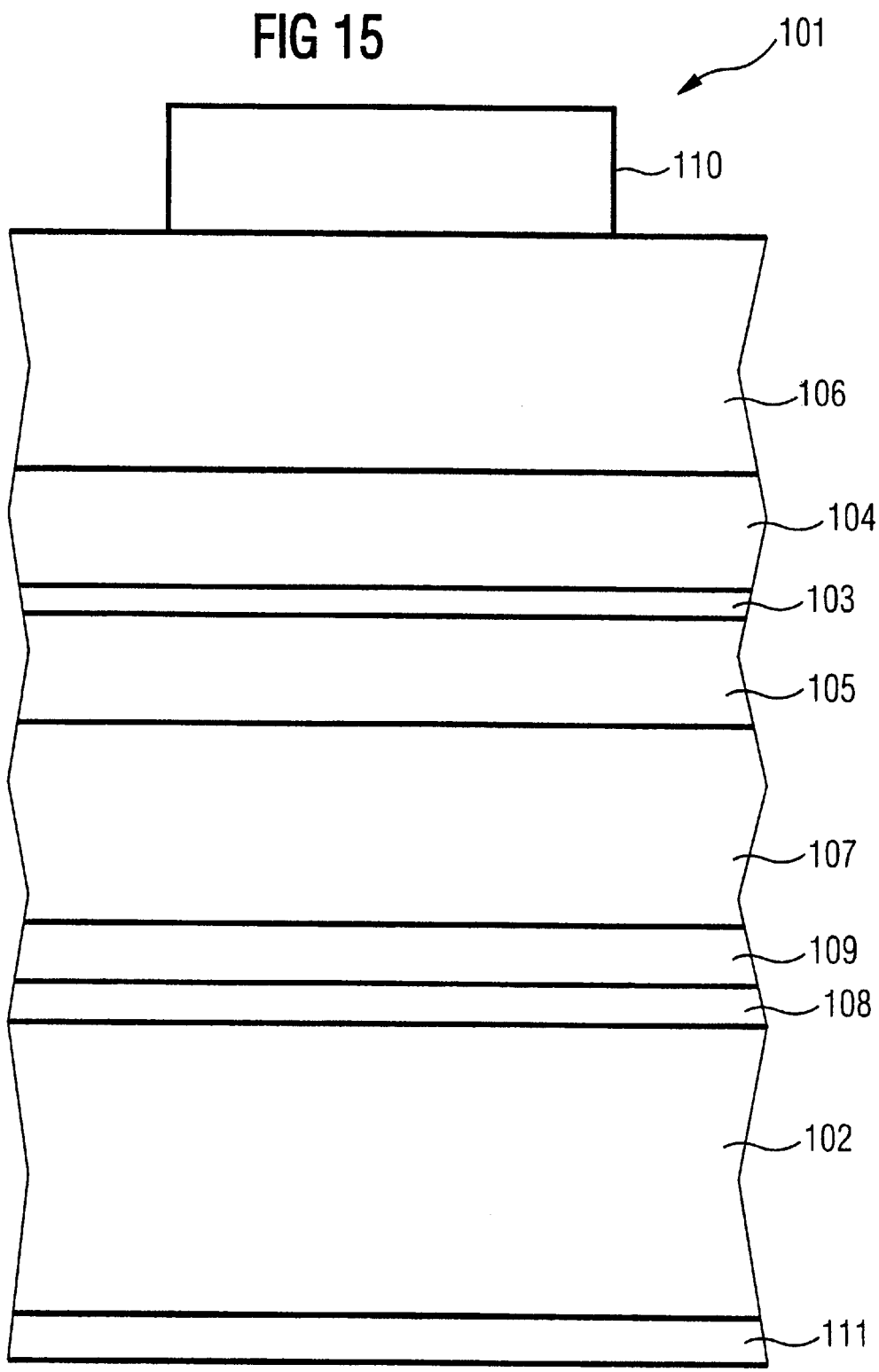

II-VI SEMICONDUCTOR COMPONENT HAVING AT LEAST ONE JUNCTION BETWEEN A LAYER CONTAINING SE AND A LAYER CONTAINING BETE, AND PROCESS FOR PRODUCING THE JUNCTION

CROSS-REFERENCE TO RELATED APPLICATION

This is a continuation of copending International Application PCT/DE98/01913, filed Jul. 9, 1998, which designated the United States.

BACKGROUND OF THE INVENTION

Field of the Invention

The invention lies in the semiconductor technology field. More specifically, the present invention relates to a II-VI semiconductor component having at least one junction between a layer containing Se and a layer containing BeTe, and to a process for producing the junction. It relates, in particular, to a low-loss contact with a p-conducting mixed crystal based on II-VI semiconductor materials such as, for example, ZnSe.

A plurality of processes are used for the production of electrical contacts on II-VI semiconductor components. In particular, considerable difficulties are encountered in this regard for such components made of mixed crystals based on ZnSe.

It has been found that, in the production of contacts on p-conducting ZnSe, it is inappropriate to use a simple metal contact. Due to the very high valence band affinity of ZnSe a simple metal contact will always lead to the formation of a high Schottky barrier at the metal/p-type semiconductor junction. Positive charge carriers can tunnel through such a high Schottky barrier only with difficulty.

The tunneling effect can be amplified by increasing the doping of the p-type ZnSe using very low growth temperatures, and thereby narrowing the potential barrier (cf. J. Qiu et al., Journal of Crystal Growth 12 (1993), p. 279 et seq.). Other attempts to increase the conductivity through the p-type contact on ZnSe make use of a highly conductive HgSe layer which is fitted between the metal contact and the p-type ZnSe (cf. Y. Lansari et al., Applied Physics Letters 61 (1992), pages 2554 et seq.).

Increased edge doping can also take place using a near-surface p-type ZnTe layer, which also has lower valence band affinity (corresponds to higher valence band energy) than ZnSe. A flatter Schottky barrier is therefore formed. Holes can overcome the flatter Schottky barrier more easily when the acceptor concentration is high.

Lowering the valence band affinity at the surface in order to improve the ohmic contact properties runs up against the problem that, owing to the different valence band affinity of the component cover layer (for example based on ZnSe), and of the superficial contact layer (consisting, for example, of ZnTe or BeTe), a barrier is created for holes in the semiconductor body which makes transport through the semiconductor contact structure more difficult.

It is known that the valence band discontinuity of isovalent interfaces, for example ZnSe/ZnTe or GaAs/AlAs, can only be adjusted to a small extent (cf. R. G. Dandrea, C. B. Duke, Journal of Vacuum Science and Technology B 10(4) (1992), page 1744). There is accordingly as yet no known method by which the band discontinuity at a junction such as, for example, from ZnTe to ZnSe or from BeTe to ZnSe can be reduced and the charge carrier transport thereby facilitated. With the large valence band discontinuity between BeTe and ZnSe, about 1.2 eV, or between ZnTe and ZnSe, about 0.8 eV, it is not possible to use processes for overcoming the potential barrier as are described, for example, in F. Capasso et al., Journal of Vacuum Science and Technology B 3(4) (1985), pages 1245–51, or in H. J. Gossmann et al., Critical Reviews in Solid State and Materials Science 18(1) (1993), pages 1–67.

For this reason, contact layer sequences have been proposed in which the valence band energy near the surface is gradually increased by applying semiconductor multilayers, so that the valence band edge jump is flattened and the hole barrier between ZnSe and ZnTe or between ZnSe and BeTe is lowered. For example, it has been proposed to use ZnSe/ZnTe multilayers, by means of which the valence band energy of the ZnSe within a near-surface region is raised to the valence band energy of ZnTe, and it is thus possible to produce a contact with a small Schottky barrier which has low impedance, and in particular ZnTe can be produced with high p-type conductivity (cf. WO94/15369 and Y. Fan et al., Applied Physics Letters 61 (1992), pages 3161 et seq.). This structure is referred to in the literature as "grading" or "pseudograding". A similar contact structure employs the material BeTe instead of ZnTe in BeTe/ZnSe multilayers as a p-type contact, as described in WO94/15369, in P. M. Mensz, Applied Physic Letters 64(16) (1994), page 2148 or in U.S. Pat. No. 5,422,902. This is expected to give the contact layer an increased crystalline quality, which prevents lattice defects which are detrimental to the operation of a component. With the facility of producing lattice-matched BeTe/ZnSe "pseudograding" heterostructure contacts with good structural quality, the p-conducting electrical connection to a II-VI component can also be put onto the interface with a p-conducting substrate, as discussed in WO94/15369.

The described pseudograding contact has a complicated structure with many internal interfaces. It consists of a multilayer in which BeTe alternates with ZnSe, the layer thickness proportions of these two components being varied gradually. The total thickness of the ZnSe/BeTe contact layer sequence is between 200 Å and 1000 Å (cf. P. M. Mensz, Applied Physic Letters 64(16) (1994), page 2148 or U.S. Pat. No. 5,422,902). Over this length, the average BeTe concentration is adjusted in steps from 0 to 100% by increasing the BeTe layer thickness while at the same time reducing the ZnSe layer thickness. With the usual production parameters for BeTe and ZnSe, the total resistance of the BeTe/ZnSe contact structure is in the range from $10^{-2}$ to $10^{-3}$ $Wcm^2$, and therefore leads to high electrical losses in the contact structure. The high resistance is attributed to the large valence band discontinuity between BeTe and ZnSe, which is 1.21 eV.

There arises another problem in the context of the contact structures with ZnSe/ZnTe or ZnSe/BeTe multilayers (pseudograding), namely when the concentrations of the dopant nitrogen are high, a large number of lattice defects are produced and make it possible for the superlattice matrix elements and the dopant to interdiffuse. Such defects can also aggregate and produce extended lattice defects in contact, which can greatly disrupt the operation of a laser diode and therefore shorten its life.

Another problem of the BeTe/ZnSe pseudograding contact is that, with the layer thicknesses used, ripples occur on the interfaces between BeTe and ZnSe which are created in order to reduce the elastic prestresses. This unevenness also has a negative effect on the functioning of a laser diode.

The transfer of holes from the valence band of, for example, BeTe to the valence band of ZnSe occurs not only in contact structures, but is also relevant, for example, in vertically emitting lasers with Bragg reflectors that contain BeTe and ZnSe. For such component structures, the use of extended grading or pseudograding is highly disadvantageous.

SUMMARY OF THE INVENTION

It is accordingly an object of the invention to provide a II-VI semiconductor component with an improved junction from an Se-containing layer (e.g., a ZnSe layer) and a BeTe-containing layer, which overcomes the above-mentioned disadvantages of the heretofore-known devices and methods of this general type. It is a further object to provide a simple process for reproducible production of the junction.

It is a particular object to provide a contact in which the valence band discontinuity at an interface between a layer containing BeTe and a layer containing ZnSe is greatly reduced, and low-loss transfer of holes from the layer containing BeTe to the layer containing ZnSe can be achieved, in particular for p-conducting layers. The intention is especially to provide contact structures with which it is possible to produce low-loss p-type contact with p-conducting II-VI semiconductor layers that contain ZnSe.

The term materials containing BeTe is used below to denote materials such as, for example, $Be_xMg_yZn_{1-x-y}Te$, $Be_xCd_yZn_{1-x-y}Te$, $Be_xMg_yCd_{1-x-y}Te$, $Be_xMn_yZn_{1-x-y}Te$, $Be_xSr_yZn_{1-x-y}Te$, $Be_xBa_yZn_{1-x-y}Te$ (0x1, 0y1, x+y1) or other mixed crystals, that contain Be and Te or tellurium.

The term materials containing ZnSe is used below to denote materials such as, for example, $Be_xMg_yZn_{1-x-y}Se$, $Be_xCd_yZn_{1-x-y}Se$, $Be_xMg_yCd_{1-x-y}Se$, $Be_xMn_yZn_{1-x-y}Se$, $Be_xSr_yZn_{1-x-y}Se$, $Be_xBa_yZn_{1-x-y}Se$ (0x1, 0y1, x+y1) or $Zn_xMg_{1-x}S_ySe_{1-y}$ or $Be_xZn_{1-x}SySe_{1-y}$ (0<=x<=1, 0<=y<=1) or other mixed crystals, that contain Zn and Se or selenium.

With the foregoing and other objects in view there is provided, in accordance with the invention, a II-VI semiconductor component, which comprises a layer sequence including a semiconductor layer containing BeTe and a semiconductor layer containing Se and forming a junction therebetween with an interface, wherein the interface between the semiconductor layer containing BeTe and the semiconductor layer containing Se within the layer sequence is prepared such that a Be—Se bond configuration is formed.

In other words, according to the invention, within a layer sequence, e.g. a contact region, on an active layer sequence of an optoelectronic II-VI semiconductor component (light-emitting or light-receiving), at least one semiconductor layer containing BeTe is applied epitaxially (e.g. using MBE or MOCVD) on at least one semiconductor layer containing Se, in particular containing ZnSe, or at least one semiconductor layer containing Se is similarly applied on at least one semiconductor layer containing BeTe, and an interface between the semiconductor layer containing BeTe and the semiconductor layer containing ZnSe is prepared, in particular by introducing an Se-rich interlayer, in such a way that a Be—Se configuration is formed, which represents a potential barrier (valence band discontinuity) for holes of less than 1.2 eV.

This interfacial configuration is produced according to the invention by always ending or starting the epitaxial growth of ZnSe with Se coverage and/or growing ZnSe under Se-rich conditions.

In accordance with an added feature of the invention, the potential barrier for holes is less than 0.4 eV.

In accordance with an additional feature of the invention, a junction layer formed of an alloy with graded variation in composition is disposed between the semiconductor layer containing Se and the semiconductor layer containing BeTe.

In accordance with a preferred embodiment, the graded alloy is a digital graded alloy.

In accordance with another feature of the invention, at least one layer delta-doped with acceptors is inserted between the semiconductor layer containing Se and the graded alloy or digital graded alloy.

In accordance with again another feature of the invention, at least one layer delta-doped with donors is disposed between the graded alloy or digital graded alloy and the semiconductor layer containing BeTe.

In accordance with again an added feature of the invention, at least one layer doped with acceptors is inserted in the semiconductor layer containing Se, at a given distance from the interface between the semiconductor layer containing BeTe and the semiconductor layer containing Se.

In accordance with a related feature of the invention, at least one layer doped with acceptors is inserted in the semiconductor layer containing BeTe, at a given distance from the interface between the semiconductor layer containing BeTe and the semiconductor layer containing Se.

With the above and other objects in view there is also provided, in accordance with the invention, a method of producing the above-outlined II-VI semiconductor component, which comprises epitaxially growing the layer containing Se and ending or starting the epitaxial growth with Se coverage and/or growing the layer containing Se under Se-rich conditions.

In accordance with yet an added feature of the invention, an Se flux is applied to the surface of the layer containing Se before the growth of the layer containing BeTe.

In accordance with a concomitant feature of the invention, the Be—Se configuration is prepared by growing the layer containing Se under excess Se.

In a preferred process for the interface preparation according to the invention, the configuration at the interface is achieved by, after having grown a ZnSe layer and before growing a BeTe layer, applying an Se flux with a beam-equivalent pressure between $1 \times 10^{-5}$ and $1 \times 10^{-8}$ torr to the surface of this ZnSe layer, e.g. for from 0.5 to 60 seconds. The substrate temperature is in this case between 150° C. and 350° C., but preferably between 200° C. and 250° C.

The Se surface stabilization may be followed by a growth pause of up to 20 seconds, but preferably less than 5 seconds, although this may be omitted.

On the Se-stabilized ZnSe/Se surface produced in this way, which can be identified by clear (2×1) surface reconstruction in RHEED (reflection high energy electron diffraction) measurements, the BeTe layer is applied in such a way that, during the growth of the BeTe layer, the flux ratio between Te and Be is between 2 and 50, and a Te:Be ratio is preferably set between 2 and 10. Following the BeTe growth, the growth is interrupted for from 0 to 180 seconds, preferably between 1 and 10 seconds. During this, the substrate temperature is maintained at the ZnSe growth temperature of from 200° C. to 250° C., although it may also be increased up to 550° C. Following the interruption to the growth, Se is applied on the surface at substrate temperatures of between 150° C. and 350° C. for from 0 to 180 seconds. It is then possible to start growing ZnSe on a BeTe/Se surface prepared in this way.

In another preferred variant of the method according to the invention, the Be—Se configuration of the interface is prepared by growing ZnSe with excess Se (Se:Zn ratio 1.1:1 to 5:1), preferably at substrate temperatures of between 150° C. and 350° C. The ZnSe growth rate is then advantageously between 0.1 and 1 monolayer. Such growth conditions lead to a clear (2'1) reconstruction on the ZnSe surface. In this case, there need not necessarily be a growth interruption at the interfaces.

The effect achieved with the described process is that, at the interface between BeTe and ZnSe, a bond is formed between Be and Se, but not between Zn and Te. In this case, use is made of the displacement of Te atoms, which are in a bound state on the BeTe surface, by Se atoms. Conversely, displacement of Se by Te does not take place on the ZnSe surface. The advantage of the interface with Be—Se configuration is that the valence band discontinuity between layers containing BeTe and layers containing ZnSe is reduced from above 1.2 eV to about 0.4 eV. In novel contact structures, for example of BeTe and ZnSe, this remaining potential barrier for holes in the valence band can be reduced further by controlled doping with acceptors and donors.

The contact structure according to the invention is, in particular, intended for an optoelectronic component on a substrate made of a material from the group consisting of GaAs, InAs, InGaAs, GaP, InP, Si, Ge, ZnO, ZnSe, ZnTe, CdTe, ZnCdTe having an active layer intended to produce radiation, in which the active layer is designed as a quantum well or superlattice with predetermined period, or multiple quantum well or quantum dot structure, in which the active layer is arranged between layers that are doped for electrical conductivity with the opposite sign to one another, and in which there are electrical contacts that consist of a sequence of materials containing selenium and layers containing BeTe, and there is an interface between the layers belonging to these material groups in the contact layer sequence, and this interface is prepared in such a way as to create an interfacial organization at the material junction with a valence band discontinuity of less than 1.2 eV.

The material containing ZnSe is in this case preferably from the group $Be_xMg_yZn_{1-x-y}Se$, $Be_xCd_yZn_{1-x-y}Se$, $Be_xMg_yCd_{1-x-y}Se$, $Be_xMn_yZn_{1-x-y}Se$, $Be_xSr_yZn_{1-x-y}Se$, $Be_xBa_yZn_{1-x-y}Se$ ($0 \leq x \leq 1$, $0 \leq y < 1$, $x+y \leq 1$), $Zn_xMg_{1-x}S_ySe_{1-y}$, $Be_xZn_{1-x}S_ySe_{1-y}$ ($0 \leq x \leq 1$, $0 \leq y \leq 1$), and the layer containing BeTe from the group $Be_xMg_yZn_{1-x-y}Te$, $Be_xCd_yZn_{1-x-y}Te$, $Be_xMg_yCd_{1-x-y}Te$, $Be_xMn_yZn_{1-x-y}Te$, $Be_xSr_yZn_{1-x-y}Te$, $Be_xBa_yZn_{1-x-y}Te$ ($0 \leq x \leq 1$, $0 \leq y \leq 1$, $x+y \leq 1$), $Be_xZn_{1-x}S_yTe_{1-y}$ ($0 \leq x \leq 1$, $0 \leq y \leq 1$), $Be_xCd_{1-x}S_yTe_{1-y}$ ($0 \leq x \leq 1$, $0 \leq y \leq 1$), $Be_xMg_{1-x}S_ySe_{1-y}$ ($0 \leq x \leq 1$, $0 \leq y \leq 1$).

The interfacial organization with a small valence band offset is a Be—Se configuration at the interface. The latter is preferably formed by, during the production of the semiconductor layers, covering the layers containing ZnSe and/or the layers containing BeTe with selenium from a selenium particle flux at the interface which is formed.

In one refinement, at least one layer with increased acceptor concentration is inserted in the layer containing ZnSe, at a distance d from the interface between the layer containing BeTe and the layer containing ZnSe. The distance d is preferably smaller than 40 Å.

A layer with increased sheet charge density may contain tellurium or BeTe. Each layer with increased sheet charge density is, for example, between 0.5 monolayer and 5 monolayers thick. Instead of the layer containing BeTe, a metal contact may be applied directly on the layer containing ZnSe. A layer with increased acceptor concentration may be placed at a distance d1 from the interface in the layer containing ZnSe, and a layer with donors may be placed at a distance d2 from the interface in the layer containing BeTe. The distances d1 and d2 may be of different or equal value. The acceptor concentration or donor concentration in the heavily doped layers may be of different or equal value. The distance d1+d2 is, for example, between 5 Å and 300 Å. The level of the sheet charge densities in the heavily doped layers may be more than $10^{12}$ cm$^{-3}$, and the thickness of the heavily doped layers is, for example, no more than 50 monolayers. The area doped with donors contains, for example, selenium or ZnSe. Al, Cl, Br or iodine may be used as donor dopant. The area heavily doped with acceptors contains, for example, Te or BeTe and, for example, N, As, Sb, P or another element from main group I, IV or V is used as acceptor dopant.

A junction layer, which consists of an alloy with graded variation in composition, may be placed between a layer containing ZnSe and a layer containing BeTe.

All the layers containing ZnSe and BeTe may be doped with p-type conductivity. The alloy may be formed as a digital alloy. The variation in the composition of the graded or digital graded alloy is linear or nonlinear. At least one delta-doped layer with an increased acceptor concentration may be inserted between the layer containing ZnSe and the graded or digital graded alloy. At least one delta-doped layer with donors may be placed between the graded or digital graded alloy and the layer containing BeTe. Al, Cl, Br or I may be used as donor dopant. The delta-doped layers are, for example, between 0.5 and 50 monolayers thick. The sheet charge density in the layers delta-doped with acceptors and donors may be the same, and adjusted as a function of the separation of the delta-doped layers in such a way that the internal electric field of the doping dipole which is created compensates for the potential gradients within the graded or digital graded alloy. The separation of the delta-doped layers is, for example, less than 300 Å.

Other features which are considered as characteristic for the invention are set forth in the appended claims.

Although the invention is illustrated and described herein as embodied in a II-VI semiconductor component having at least one junction between a layer containing se and a layer containing BeTe, and process for producing the junction, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7 shows the dependency of the sheet charge density on the width of the graded alloy, as used in FIGS. 5A and 5B;

FIG. 8 is a diagrammatic section of the layer structure with doping dipole near the interface;

FIG. 10 shows the required sheet charge density as a function of the reduction in the potential barrier for various separations of the doping dipole;

FIG. 12 shows a simplified representation of the band diagram in the vicinity of a metal/semiconductor junction while taking into account a d-doped layer near the interface (FIG. 12A), and the simplified representation of the band diagram in the vicinity of a semiconductor/semiconductor junction while taking into account a d-doped layer near the interface (FIG. 12B);

FIG. 13 shows the dependency of the sheet charge density on the distance d of the d-doped layer from the interface between a material containing BeTe and a material containing ZnSe, as found in FIG. 11B, and an estimate for the achievable contact resistances for various values of the valence band discontinuity;

FIG. 14 is a diagrammatic section of the layer structure of a light-emitting or laser diode with a contact structure according to the invention on the other side of the active zone from the substrate; and FIG. 15 is a diagrammatic section of the layer structure of a light-emitting or laser diode with a contact structure according to the invention which is arranged on the same side of the active zone as the substrate.

DESCRIPTION OF THE PREFERRED EMBODIMENTS

Figure 3:
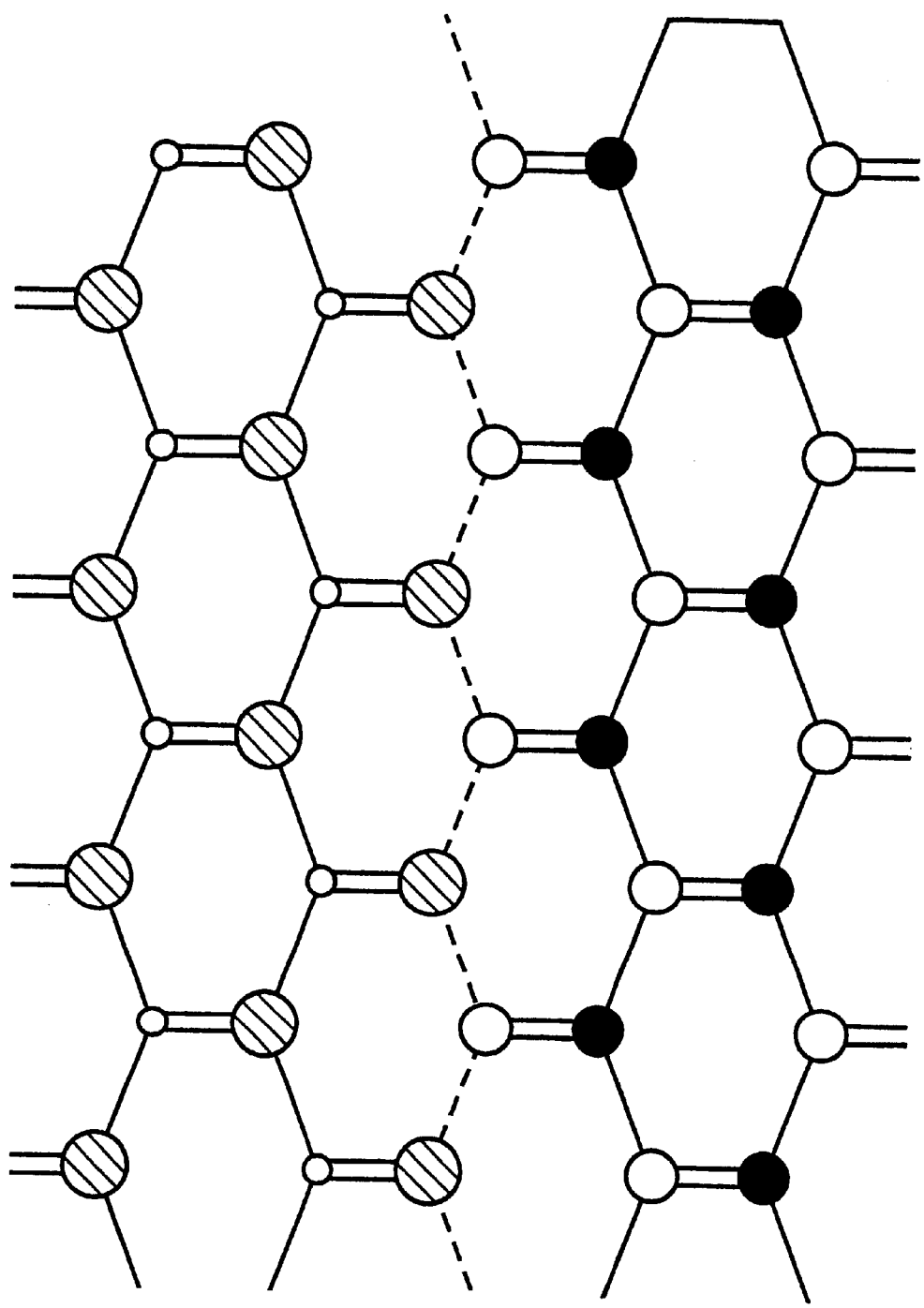
FIG. 3 shows a schematic representation of a BeTe/ZnSe interface with a Zn—Te configuration.

Referring now to the figures of the drawing in detail and first, particularly, to FIG. 3 thereof, there is seen a projection of a zinc blende crystal lattice with a schematic representation of the interface between ZnSe and BeTe, as occurs when a layer containing BeTe is applied on a Zn-covered ZnSe layer. The Zn—Te configuration of the interface is symbolized by dashed bond lines. This configuration can be produced by controlled Zn surface coverage of the underlying ZnSe layer. It can also be created when ZnSe is formed under Zn-rich growth conditions and BeTe is deposited on top. The formation of this interface can be identified by the fact that the ZnSe surface has a c(2×2) reconstruction under RHEED measurement prior to the application of BeTe. With the reverse sequence (ZnSe on BeTe), this configuration can be obtained if the growth of ZnSe on BeTe with a Te-rich surface initially starts with ZnSe surface coverage or, again, Zn-rich conditions prevail in the molecular beams.

Figure 4:
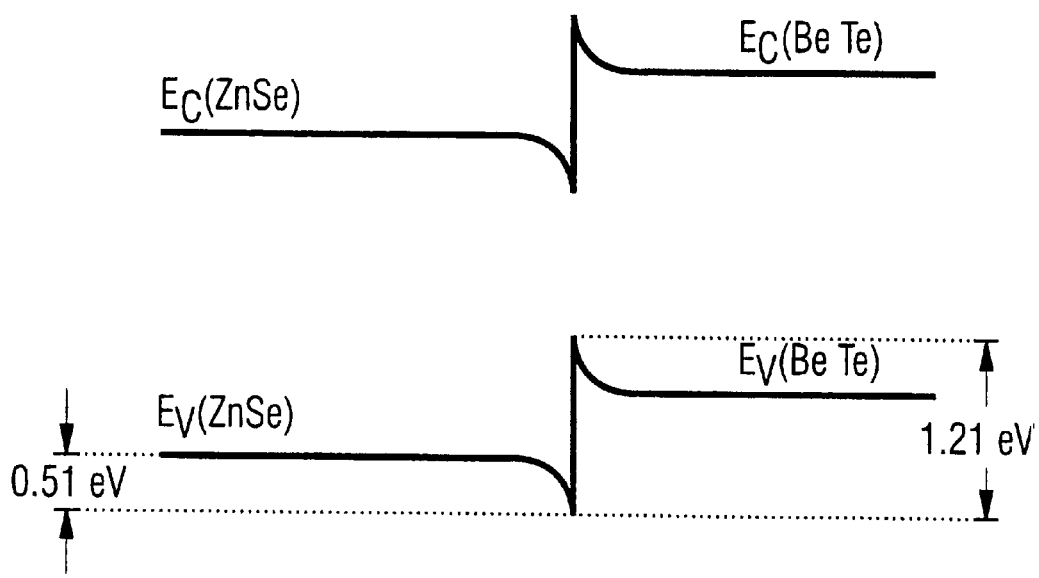
FIG. 4 shows a simplified representation of the band diagram for a BeTe/ZnSe junction with Zn—Te interfacial configuration.

At such an interface, an energy barrier of about 1.21 eV is created for positive charge carriers (holes) in terms of transfer from BeTe to ZnSe, as shown in FIG. 4. This value was measured using UPS (UV photoelectron spectroscopy) with a ZnSe/BeTe junction prepared according to the above-described process.

Figure 1:
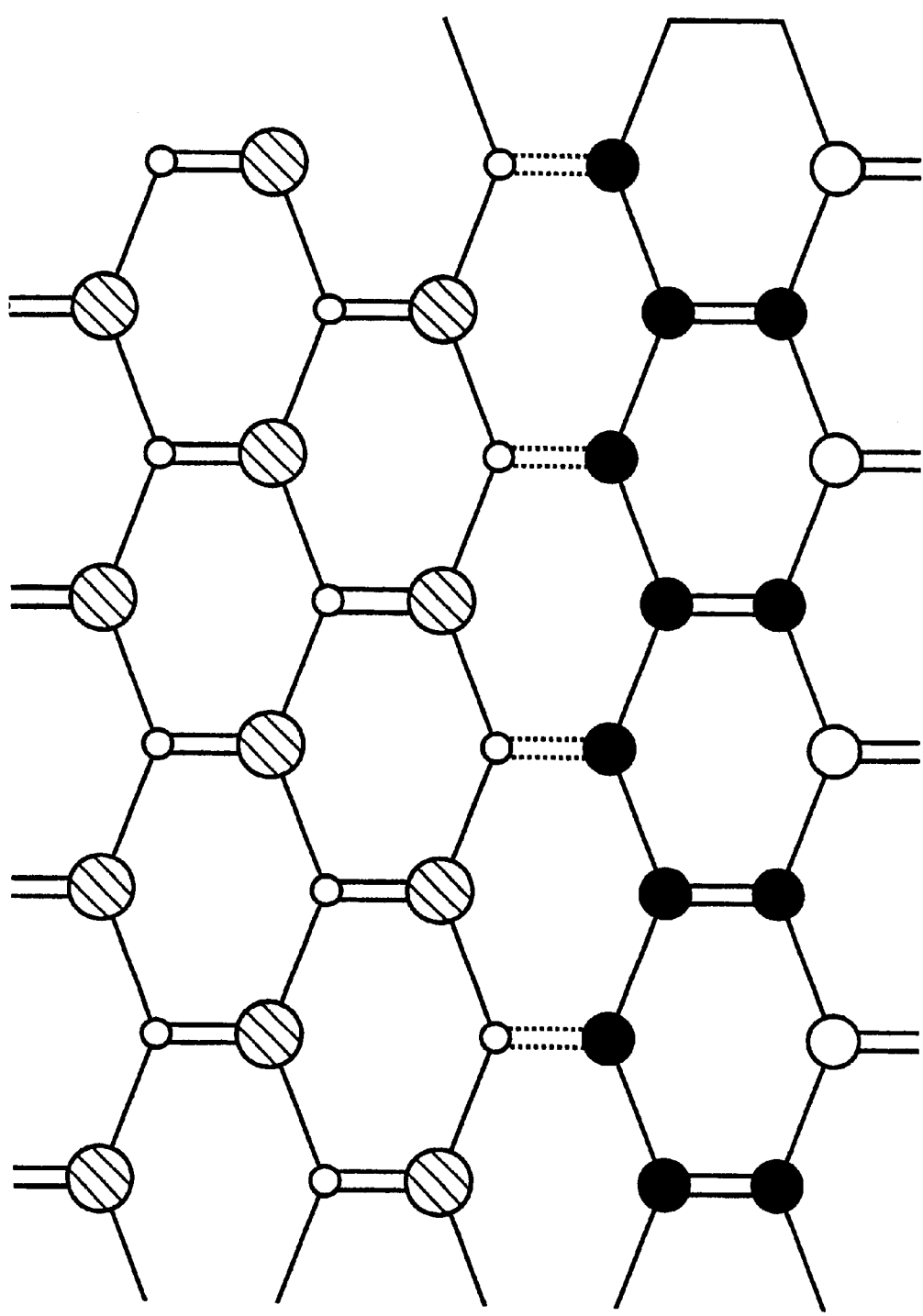
FIG. 1 shows a schematic representation of a BeTe/ZnSe interface with a Be—Se configuration.
Figure 2:
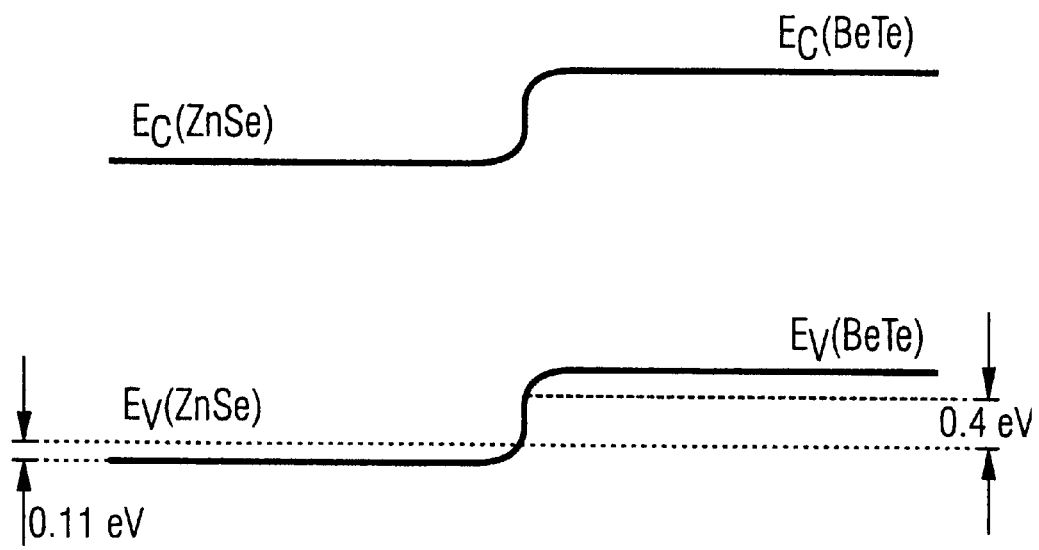
FIG. 2 shows a simplified representation of the band diagram for a BeTe/ZnSe junction with Be—Se interfacial configuration.

Referring now to FIG. 1, the projection of a zinc blende crystal lattice onto the {110} plane shown therein is a schematic representation of the interface between ZnSe and BeTe, as is created when a layer containing BeTe is applied on an Se-covered ZnSe layer. In this representation, bonds pointing into or out of the plane of the drawing are marked by a double line. The Be—Se bond configuration of the interface is symbolized by dashed bond lines. This configuration can be produced by controlled Se surface coverage of the underlying ZnSe layer, or is created when ZnSe is created under Se-rich growth conditions and BeTe is deposited on top. The formation of this interface can be identified by the fact that the ZnSe surface has a (2×1) reconstruction under RHEED measurement prior to the application of BeTe. With the reverse sequence (ZnSe on BeTe), this configuration can be obtained when the growth of ZnSe on BeTe is under Se-rich conditions or begins with Se bombardment prior to the growth. At such an interface, an energy barrier of about 0.4 eV is created for positive charge carriers (holes) in terms of transfer from BeTe to ZnSe, as shown in FIG. 2. This value is significantly lower than for the Zn—Te configuration at the interface (FIG. 3 and FIG. 4). This reduction in the hole barrier between BeTe and ZnSe is the aim of the process according to the invention for the production of low-impedance contacts with ZnSe, since with the incorporation of doping in the ZnSe and BeTe the remaining 400 meV barrier can be overcome very easily by holes. In a contact structure in which transfer from BeTe to ZnSe and vice versa is used, with the interface preparation according to the invention (see discussion with reference to FIG. 1 and FIG. 2) it is possible to obtain a smaller voltage drop than in the case of interfaces created between BeTe and ZnSe under normal growth conditions (e.g. stoichiometric Zn:Se ratio).

With the reduction in the valence band discontinuity between BeTe and ZnSe, and the possibility of heavily doping the BeTe with p-type conductivity and heavily doping ZnSe with n-type conductivity, the electrical transfer of holes from layers containing BeTe to layers containing ZnSe is facilitated in a straightforward way.

Figure 5A:
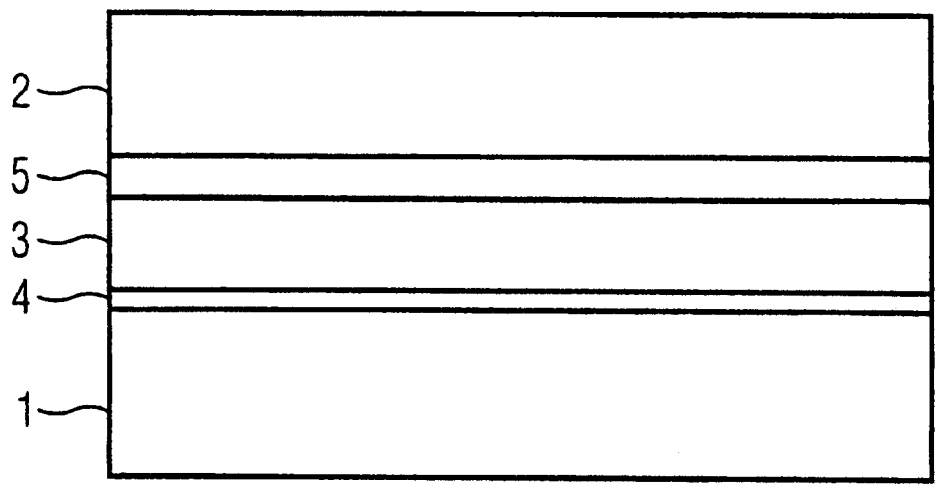
FIG. 5 is a diagrammatic section of the layer structure of a contact structure according to the invention with graded alloy (FIG. 5A) and a diagrammatic section of the layer structure of a contact structure according to the invention with graded digital alloy (FIG. 5B)
Figure 5B:
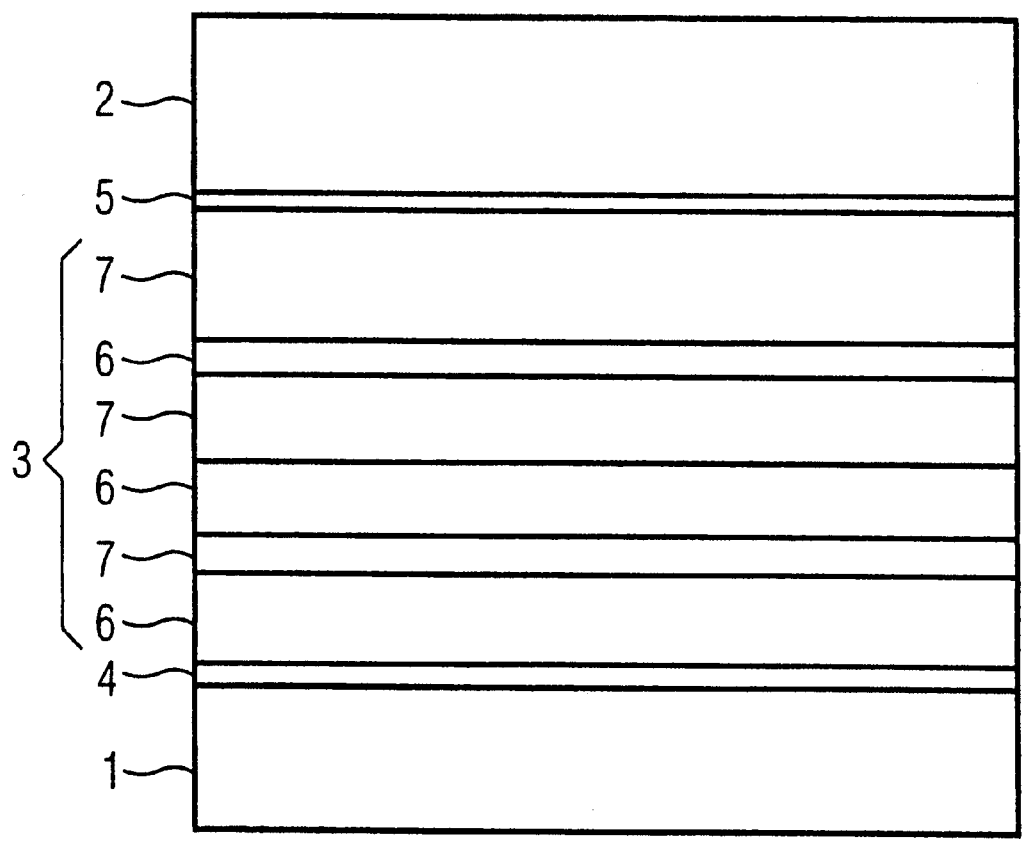

This is done according to the invention, for example, with a layer sequence as schematically represented in FIGS. 1A and 5B. In this case, a junction layer 3 is placed between a layer 1 containing ZnSe and a layer 2 containing BeTe. The junction layer may consist of an alloy whose composition is gradually varied in such a way that, starting from the composition of layer 1, the composition of the layer 3 is changed gradually to the composition of layer 2 over an area with width w, as indicated in FIG. 5A. This variation in composition may take place in a nonlinear way, but preferably takes place in a linearly graded way. It can also be achieved by changing the concentrations of the alloy constituents in layer 3.

The invention also proposes to insert, at the interface between the layer 1 containing ZnSe and the layer 3, a thin layer 4 which has an increased acceptor concentration. On the side of the graded alloy 3 next to the layer 2, a thin layer 5 which has an increased donor concentration is inserted so that the electric field set up between the ionized acceptor rumps in layer 4 and the ionized donor rumps in layer 5 compensates for the potential gradient inside the graded alloy 3. The thickness of the δ-doped layers 4 and 5 may be between 0.5 and 50 monolayers.

FIG. 5B represents a preferred way of varying the composition of layer 3, starting with the composition of layer 1 and ending up with the composition of layer 2, which consists in forming a so-called digital alloy. In a digital alloy, the concentrations of the alloy constituents are adjusted by applying very thin layers of different materials on top of one another, so that the layer thickness ratio gives the average concentration of the layer sequence. The graded variation in the composition of the digital alloy 3 can be obtained by gradual variation of the layer thickness ratio between the layers 6 containing ZnSe and the layers 7 containing BeTe in FIG. 5B, as is for example done in a pseudograding structure.

In the layer sequence according to the invention with a digital alloy according to FIG. 5$b$, the δ-doped regions 4 and 5 are introduced by increased doping with acceptors (δp) of the first layer 4 containing BeTe within the digital alloy 3. The boundary layer which, according to the invention, is doped with donors (δn) and which lies at the boundary between the layer 2 containing BeTe and the digital alloy 3 can be formed by n-type doping of the last layer 5 containing ZnSe.

In a preferred embodiment of the contact structure according to the invention (FIG. 5B), the digital alloy 3 starts being constructed on the layer 1 containing ZnSe with a two monolayer thin layer 4 containing BeTe, which is followed by an eight monolayer thin layer 6 containing ZnSe. By successively increasing the thickness of the next layer 7 by one monolayer, while simultaneously reducing the thickness of the following layer 6 by one monolayer, the layer thickness ratio within the digital alloy 3 is gradually changed with each layer pair 6, 7 to eight monolayers of layer 6 containing BeTe and two monolayers of layer 5 containing ZnSe.

The individual layers 1, 6, 7 and 2 may be doped with p-type conductivity. It is preferable to dope layers 1, 6 and 2 with p-type conductivity. Plasma-activated nitrogen or another acceptor from main group I, IV or V of the Periodic Table may be used for p-type doping. Al, Cl, Br or I may be used as donors in layer 5. The level of the doping in layers 4 and 5, and therefore the level of the interfacial charge density, is adjusted as will be described with reference to FIG. 7. A layer containing ZnTe, which has p-type conductivity and may be between 1 nm and 500 nm thick, may be deposited on the layer containing BeTe in order to prevent oxidation of the layer containing BeTe.

Figure 6A:
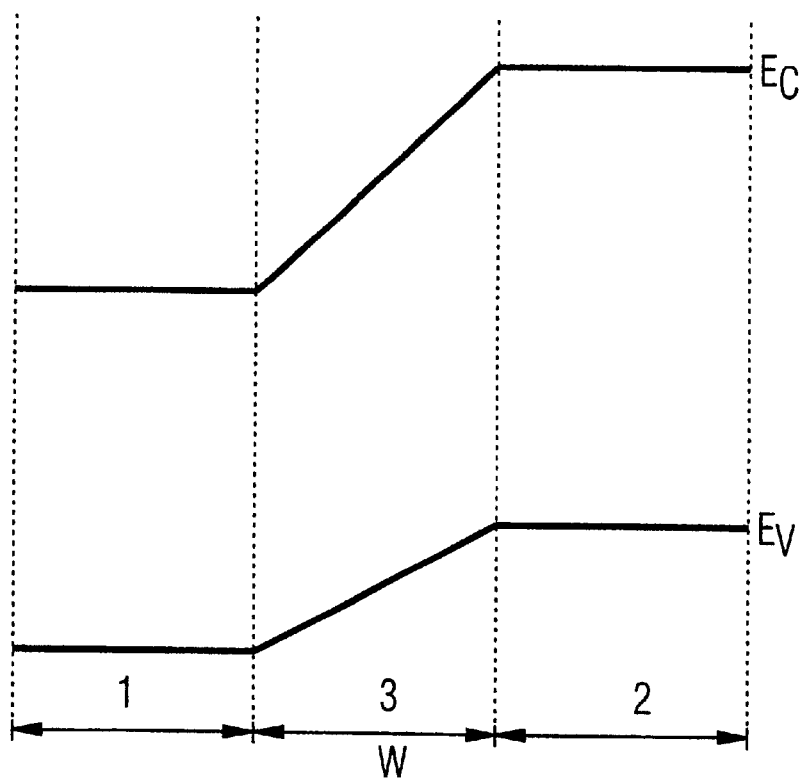
FIG. 6 shows a simplified representation of the band diagram in the vicinity of the junction layer with graded or graded digital alloy without taking into account doped areas (FIG. 6A), and the simplified representation of the band diagram in the vicinity of the junction layer with graded or graded digital alloy while taking into account an internal electric field due to the inclusion of a doping dipole in the form of thin, oppositely doped areas (FIG. 6B)
Figure 6B:
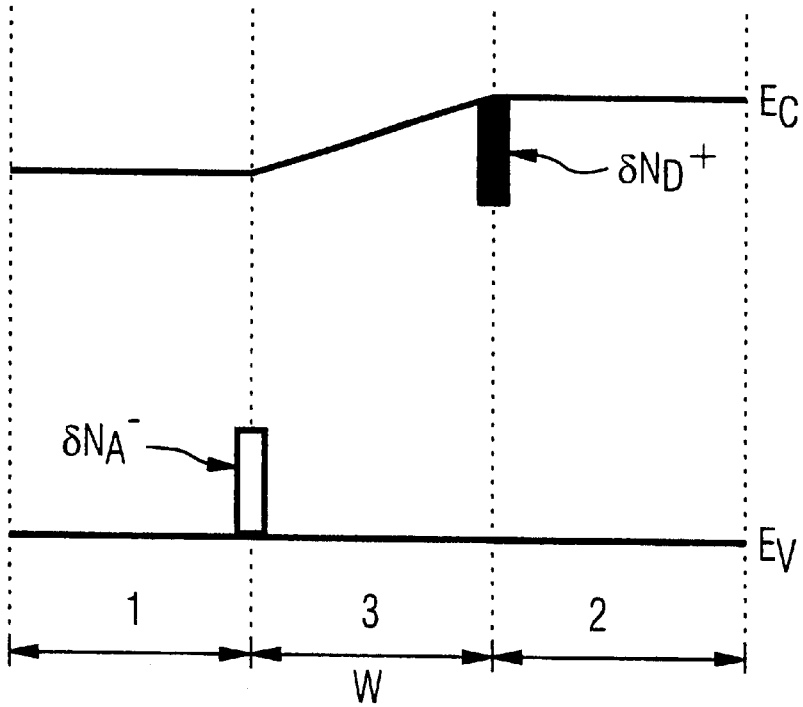

FIGS. 6A and 6B schematically show the profile of the valence band $E_v$ and the conductivity band $E_c$ within semiconductor layer structures as shown in FIGS. 5A and 5B. FIG. 6A represents the profile of the valence band $E_v$ and the conductivity band $E_c$ as result only from the graded alloy 3 without δ-doped regions (layers 4 and 5 in FIGS. 5A and 5B). In FIG. 6A, doping of layers 1, 2 and 3 is not taken into account. In FIG. 6B, the effect of an electric field set up between the δ-doped regions 4, 5 is included, by means of which it is possible to eliminate the potential barrier for holes in the valence band with suitable choice of the sheet charge density. This makes it possible to transport holes from a layer 2 containing BeTe to a layer 1 containing ZnSe. Assuming equal doping levels, the sheet charge densities δp and δn introduced into the boundary layers 4 and 5 by doping can be expressed as a function of the width of the graded alloy by $\delta p = \delta n = (\epsilon \Delta Ec)/(e^2 w)$, where $\epsilon$ is the (average) dielectric constant of the semiconductor material, ΔEc is the amplitude of the valence band discontinuity between layer 1 and layer 2, e is the elementary charge, and w is the width of the digital alloy 3. In the case of a nonlinear concentration profile within the graded or digitally graded alloy 3, the sheet charge densities δp and δn may also differ from one another, and not obey the relationship indicated above. They need to be chosen in such a way that the electric field that is set up counteracts the potential profile in the layer 3. To do this, it may be necessary to introduce several d-doped regions within the graded alloy.

For a linear variation of the potential in layer 3, the dependency of the sheet charge density [cm$^{-2}$] δp=δn is graphically represented in FIG. 7 for various barrier heights ΔEc in the valence band (valence band discontinuity) between the materials of layer 1 and layer 2, for example for ZnSe in layer 1 and BeTe in layer 2. The energy difference in the valence band ΔEc at the interface between BeTe and ZnSe can be adjusted between 1.21 eV and 0.4 eV using the interface preparation process described above with reference to FIG. 1 to FIG. 4. In the most favorable case, it is thus necessary to compensate for a potential difference of 0.4 eV by the electric field of the δ-doped dipole between layers 4 and 5. The possibility of doping ZnSe up to $5 \cdot 10^{19}$ cm$^{-3}$ with n-type conductivity and BeTe up to $10^{20}$ cm$^{-3}$ with p-type conductivity gives sheet charge densities in layers 4 and 5 in excess of $10^{13}$ cm$^{-2}$, which can be obtained by δ-doping. By reducing the valence band discontinuity between BeTe and ZnSe from 1.2 eV to 0.4 eV using the preparation process according to the invention, the width of the junction region with the digital alloy can be reduced to below 100 Å, as indicated in FIG. 7, which results in a lower electrical resistance of the contact structure. Another advantage of this configuration according to the invention is that, in layers 6 and 7 of the graded or digitally graded alloy 3, a lower level of p-doping will suffice than is necessary in a grading or pseudograding contact structure.

A layer containing ZnTe, which may be p-conducting and between 1 nm and 500 nm thick, may be deposited on the layer containing BeTe.

In another embodiment of a contact structure according to the invention, the interface between a layer containing ZnSe and a layer containing BeTe is placed within two oppositely doped layers, a so-called doping dipole, in such a way that, on the side of the layer containing BeTe, electron states in a triangular potential which is formed by the internal electric field of the dipole close to the interface, can be occupied by holes. In this energy level, holes are presented with a lower barrier for transfer to the layer containing ZnSe than in a uniformly doped layer sequence. FIG. 8 schematically represents the layer structure of a contact structure according to the invention. The interfaces between the layers 11, 12 containing ZnSe and the layers 13, 14 containing BeTe may in this case be prepared as described in the discussion of FIGS. 1 and 2. A layer 15 doped with acceptors and a layer 16 doped with donors are placed at respective distances d1 and d2 from the interface. In one refinement of the contact structure, the distances d1 and d2 are chosen to be equal, although they may also take different values. The distance from the interface should not, however, be more than 300 Å in each case. The thickness of the δ-doped regions 15 and 16 should be between 0.5 and 50 monolayers. Layers 11, 12, 13 and 14 may be undoped, although they are preferably doped with p-type conductivity.

In a preferred embodiment of the contact structure according to the invention, the region 15 heavily doped with acceptors is made of a material containing tellurium, in particular a material containing BeTe, in such a way that the layer 15 containing Te is between 0.5 and 5 monolayers thin and no localization of holes takes place in the layer 15. The introduction of donors into layer 16 may be carried out by using an n-doped material containing selenium, in particular a material containing ZnSe, with a layer thickness of from 0.5 to 5 monolayers. A layer containing ZnTe, which layer may be p-conducting and between 1 nm and 500 nm thick, may be deposited on the layer containing BeTe.

Figure 9A:
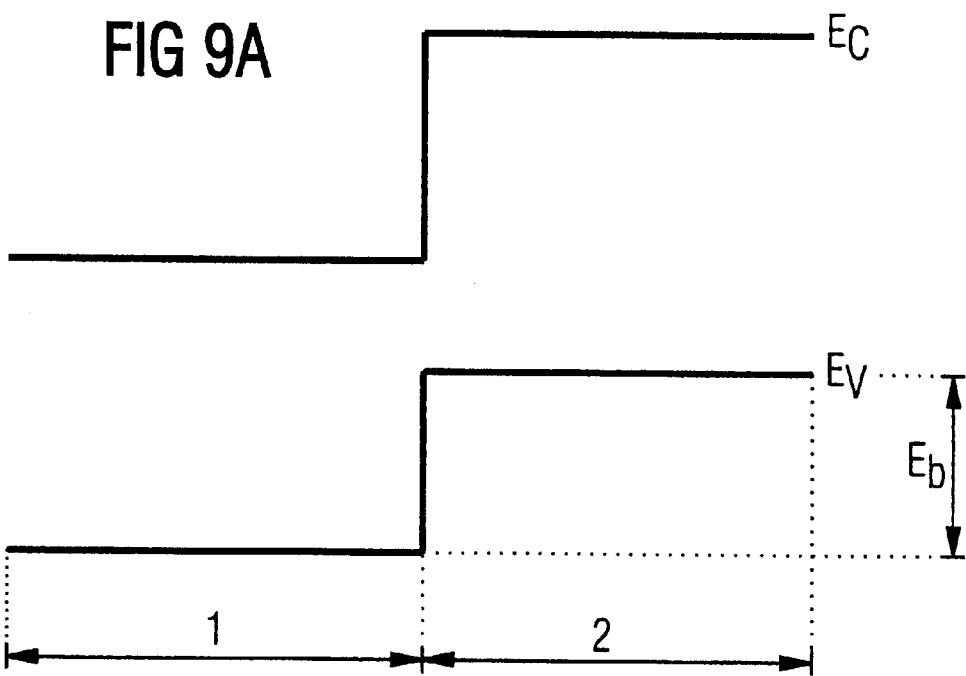
FIG. 9 shows a simplified representation of the band diagram in the vicinity of the interface between a layer containing BeTe and a layer containing ZnSe without taking doping into account (flat band edge in FIG. 9A) and a simplified representation of the band diagram in the vicinity of the interface while taking into account an internal electric field due to the inclusion of a doping dipole in the form of thin, oppositely doped areas (FIG. 9B)

FIG. 9A schematically represents the band diagram at the junction between a semiconductor containing ZnSe (region 1) and a semiconductor containing BeTe (region 2). In this representation, holes have to overcome a potential barrier $E_b$ in order to move from the BeTe valence band $E_c$ to the ZnSe valence band. When the interface is prepared for a Be—Se configuration, as described in the discussion of FIGS. 1 and 2, this barrier $E_b$=0.4 eV.

Figure 9B:
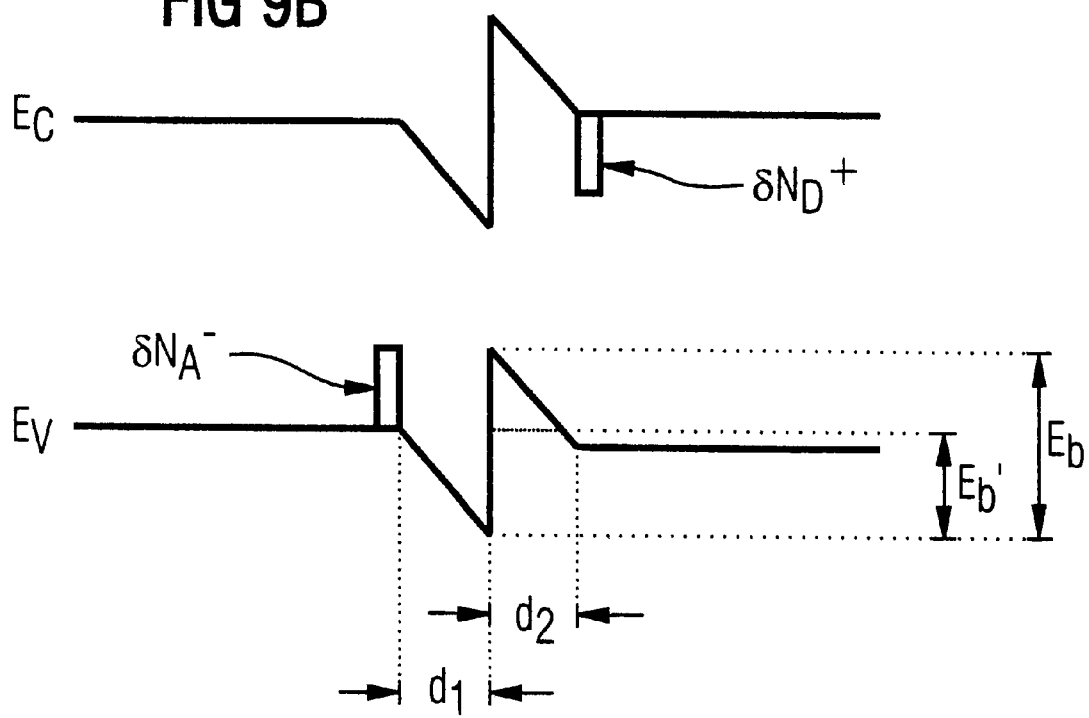

FIG. 9B shows the band diagram of the same material junction. In this representation, the introduction of a doping dipole of width d1+d2 is taken into account. As a result of the internal electric field of the dipole, a triangular potential is formed near the interface in the layer containing BeTe. In this potential well, holes can occupy an electron state from which they only need to overcome a smaller potential barrier $E_b'$, which is reduced by the value $E_b - E_b' = w \delta n / \epsilon$ relative to the uniformly doped layer sequence (FIG. 9A), $w = d_1 + d_2$ being the separation of the δ-doped layers, δn being the sheet charge density of ionized donors and acceptors, respectively, and ε being the (average) dielectric constant of the semiconductor material.

FIG. 10 shows the barrier reduction $E_b - E_b'$ [eV] as a function of the sheet charge density [cm$^{-2}$] of ionized donors and acceptors δn=δp for various widths $d_1+d_2$ of the doping dipole, it being assumed that d1 is equal to d2. For sheet charge densities of, say, $10^{12}$ cm$^{-2}$ acceptors and donors, the barrier at the interface can be lowered by more than 0.4 eV by introducing a doping dipole with a size of from $d_1+d_2$= 200 Å to $d_1+d_2$=300 Å, by means of which the 0.4 eV barrier between a layer containing BeTe and a layer containing ZnSe can be fully removed. A sheet charge density in excess of $5*10^{12}$ cm$^{-2}$ is preferable. This makes it possible for holes to enter the layer containing ZnSe with ease, leading to the formation of a low-loss contact.

Figure 11A:
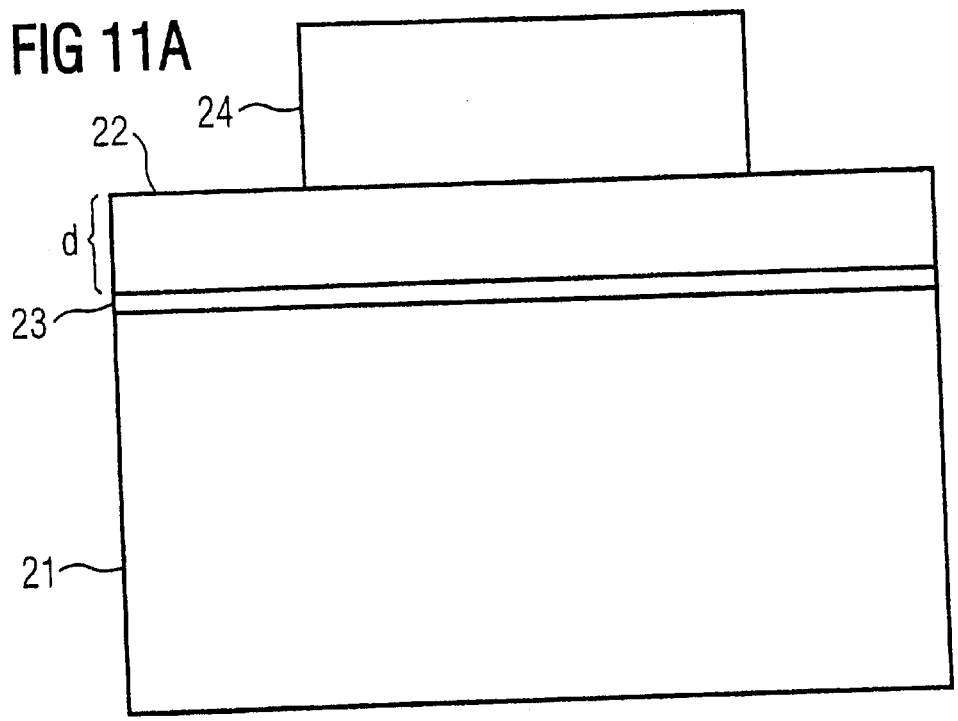
FIG. 11 is a diagrammatic section of the layer structure of a contact structure according to the invention with a d-doped area near the interface with a metal contact (FIG. 11A), and a diagrammatic section of the layer structure of a contact structure according to the invention with a d-doped area near the interface between a material containing BeTe and a material containing ZnSe (FIG. 11B)
Figure 11B:
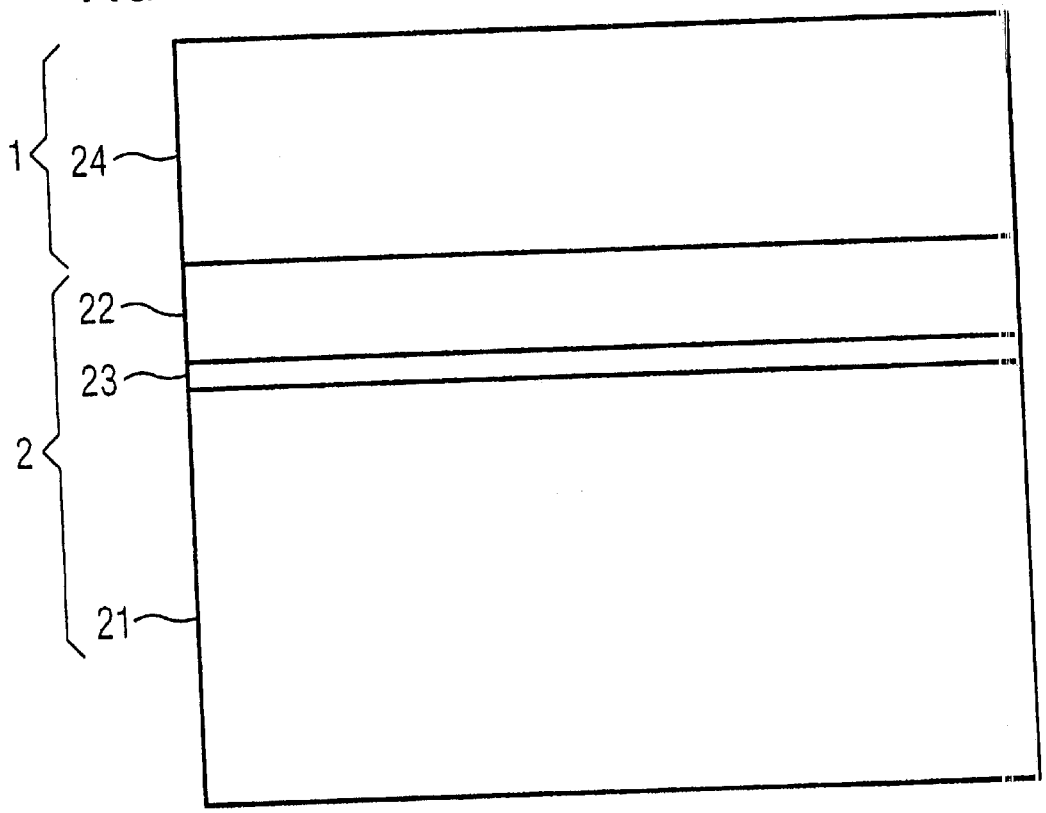

FIGS. 11A and 11B schematically represent other refinements of the contact structure according to the invention for contact with a p-conducting semiconductor material containing ZnSe. FIG. 11A illustrates the structure of a low-loss metal contact on a layer containing ZnSe. In this case, a metal contact 24 is deposited on the layer 21 and 22 containing ZnSe. A layer with increased acceptor concentration is placed at a distance d from the interface between the metal layer 24 and the layer 22 containing ZnSe, in such a way that the thickness d of the layer 22 is small enough for a sufficient tunneling hole current to flow into the layer 21 from the metal contact. In this case, care must be taken to choose the thickness of the heavily doped layer 23 to be small enough in order to fully ionize acceptors in this region and to allow no localization of charge carriers in this layer.

In particular, the metal contact 24 may consist of a plurality of layers, preferably Pd/Pt/Au or Sb/Au or other metal combinations with which a potential barrier of less than 1.2 eV is created on p-conducting ZnSe. The sequence of metals is produced following the epitaxial production of the layer sequence 21, 23, 22 by vacuum evaporation of pure metals, and the metals are preferably applied directly after the epitaxy still within the ultrahigh vacuum. The layers 21 and 22 are doped with acceptors in a concentration of between $10^{16}$ and $10^{19}$ cm$^{-3}$ and are p-conducting. The thickness d of layer 22 should be between 1 Å and 100 Å, preferably less than 40 Å.

The heavily doped layer 23 may contain ZnSe, although a material containing tellurium is preferred for layer 23. The high acceptor concentration in a layer containing Te, as occurs for example in layer 23, can be obtained by applying tellurium and the dopant at the same time, or applying Te first and—during a pause in the growth—the acceptor material using molecular beams. The thickness of the layer containing Te, for example layer 23 in FIG. 11A, should be between 0.5 monolayers (this can be done by adding Te and the dopant on a Zn-covered ZnSe surface, by means of which an Se—Zn—Te—Zn—Se sequence is obtained) and 50 monolayers. With layer thicknesses in excess of 0.5 monolayer, heavily doped BeTe may, for example, be applied as the doped layer 23, the BeTe layer thickness preferably being chosen to be between one and five monolayers. In this case, it is advantageous for the interfaces between layers, 21 and 23, or between layers 23 and 22, to be prepared in such a way as to create a Be—Se configuration, as described in the discussion of FIGS. 1 and 2. Plasma-activated nitrogen or As, Sb, P or other elements from main groups I and/or V and/or IV of the Periodic Table may, for example, be used as the acceptors.

FIG. 11B represents a schematic representation of a contact or junction structure which, in contrast to the structure shown in FIG. 11A, does not describe a junction with a metal, but the junction between a layer 21, 22 containing ZnSe and a layer 24 containing Te. The general and particular features of layers 21, 22 and 23 can be found in the description of FIG. 11A. Layer 24 consists, for example, of a material containing BeTe or ZnTe which is epitaxially applied on layer 22.

In a preferred embodiment, the material in layer 24 is heavily doped with p-type conductivity, and in particular the acceptor concentration in layer 24 is in excess of $10^{18}$ cm$^{-3}$, or layer 24 is degenerately doped. The interface between layer 22 and layer 24 is prepared with a Be—Se configuration so as to create a low potential barrier for holes. The interface may be strongly terminated with selenium, so that during the growth of the layer containing BeTe, electron states are created within the forbidden band at the material junction and Fermi-level pinning can therefore take place at the interface.

A layer containing ZnTe which is p-conducting and may be between 1 nm and 500 nm thick may be deposited on the layer containing BeTe.

FIGS. 12A and 12B show the simplified band diagram of the contact structures in FIGS. 11A and 11B, respectively. These representations show the area near the interface between a metal and a layer containing ZnSe (FIG. 12A), and the area near the interface between a material 23 containing BeTe and a material 21, 22 containing ZnSe (FIG. 12B), with the inclusion of a thin layer heavily doped with acceptors. As a result of the high acceptor concentration in the heavily doped layer (in FIGS. 12A and 12B acceptor states with a high density $\delta N_A^-$ near the valence band edge are indicated by a gray field) the Fermi level $E_F$ in the semiconductor is brought into the valence band. Holes can tunnel through the remaining potential barrier $E_b$ if the thickness of the tunneling barrier (area 22 in FIG. 12B) is small.

The minimum sheet charge density in layer 23 (FIGS. 11A and 11B) can be defined by $\delta p = \delta N_A^- (\epsilon E_b)/(ed)$. FIG. 13 represents the relationship between the distance d [m] of the heavily doped layer 23, as relates to the refinements according to FIGS. 11A and 11B, and the sheet doping $\delta p$ with acceptors (sheet charge density [cm$^{-2}$]) in the heavily doped layer 23. In the calculations for FIG. 13, $\epsilon/\epsilon_0 = 8.5$ was used and the effective mass of the holes was set at $m^*/m_0 = 0.7$. The smallest possible distances d are preferred since, in this way, the contact resistance can be reduced greatly. FIG. 13 also gives an estimate of the contact resistance [$\Omega$cm$^{-2}$].

In one advantageous refinement of the contact structure of the invention according to FIG. 11A or 11B, according to the relationship shown in FIG. 13 sheet doping in excess of $5 \cdot 10^{12}$ cm$^{-2}$ was introduced into layer 23 for a distance d=30 Å and a potential barrier $E_b$=0.4 eV. At the distance d=10 Å, about $2 \cdot 10^{13}$ cm$^{-2}$ of sheet charges were needed, which can be obtained by $\delta$-doping materials containing Te, in particular BeTe in layer 3.

FIG. 13 gives an estimate of the contact resistance in tunneling structures according to FIG. 12B for various values of the hole potential barrier. By reducing the valence band discontinuity between a material containing BeTe and a material containing ZnSe from 1.2 eV to about 0.4 eV, the contact resistance can be reduced significantly, although it should be noted that low contact resistances are to be expected only for small potential barriers at distances d smaller than about 35 Å. In this range, sheet charge densities in excess of $5*10^{12}$ cm$^{-2}$ are necessary. With customary potential barriers in excess of 1.2 eV, very much higher sheet charge densities are necessary, and these cannot be obtained with the materials used here.

FIG. 14 and FIG. 15 represent examples of the use of the described refinements of contact structures according to the invention in optoelectronic components made of II-VI semiconductors, with the aid of the layer structure of two laser or light-emitting diodes.

FIG. 14 shows a semiconductor body 101 in which a component structure which is suitable for generating light and consists of an active zone 103, which may be formed as a quantum well (QW) or superlattice (SL) or multiple quantum well (MQW) or quantum dot structure, is applied on a semiconductor substrate 102. This active zone is embedded in semiconductor barrier layers 104 (with the first conductivity type) and 105 (with the second conductivity type), which have a larger band gap than the active layer 103. The layer sequence 105, 103, 104 is adjoined by a cover layer 106 of the first conductivity type and a cover layer 107 with the second conductivity type, both of which have a lower refractive index than layers 103, 104 and 105. This component structure is connected to the substrate 102 with the second conductivity type via a buffer layer 108. On the opposite side of the active zone 103 from the substrate 102, a contact layer 109 is arranged on the outer cover layer 106 of the first conductivity type. Electrical connection can be made via a metal contact 110 lying on the surface of layer 109 and a metal contact 111 arranged, for example, on the rear of the substrate 102.

According to the invention, provision is made for the contact layer 109 applied on the upper cover layer 106 to be configured as a multilayer which, in particular, includes materials containing ZnSe and containing BeTe. The features of the contact structures according to the invention as indicated in the discussion of the refinements according to FIGS. 5A, 5A, 8, 11A and 11B and the associated figures are also features of the structure of layer 109.

When the contact layer 109 is being used on a p-conducting cover layer 106 which, in particular, contains selenium or ZnSe, in the contact layer sequence 109 according to the invention the base layer containing ZnSe within the layer sequence of layer 109 faces the cover layer 106 and the contact layer containing tellurium or BeTe faces the metal contact 110.

In a preferred refinement of the semiconductor body 101 in FIG. 14, the substrate 102 consists of n-conducting GaAs on which an n-conducting GaAs or InGaAs buffer 108 is applied using MBE. The active zone 103 is between 500 Å and 15 Å wide and consists, for example, of BeZnCdSe, ZnCdSSe or a ZnSe/BeTe superlattice with a specific period of less than 100 Å, in which the emission wavelength of the laser or light-emitting diode can be adjusted through the choice of the individual layer thicknesses of ZnSe and BeTe. The active zone may also be formed as a quantum dot structure with, for example, quantum dots containing CdSe in a ZnSe or BeMgZnSe matrix, or a different material. As the waveguide layers 104, 105 (thickness about 20 nm to 200 nm), it is possible to use BeZnSe or ZnSSe such that the lattice mismatch of the mixed crystal in layers 104 and 105 is less than 0.1% in relation to the substrate crystal. In layers 106 and 107, it is for example possible to use BeMgZnSe or ZnMgSSe or a BeMgZnSe/BeTe, ZnMgSSe/ZnSe or a BeMgZnSe/ZnSe superlattice with a specific period, such that the lattice mismatch of the mixed crystal in layers 106 and 107 is less than 0.1 in relation to the substrate crystal. Plasma-activated nitrogen, for example, may be used for p-doping the layers 104, 106 and 109. The elements I, Cl, Br, or Al may, for example, be used as donors in layers 105 and 107. Layer 108 may, for example, be doped with n-type conductivity using Si. The metal contact 110 may consist of Pd/Pt/Au, and contact 111 may for example consist of Au/Ge or In.

FIG. 15 shows a semiconductor body 101 in which a component structure which is suitable for generating light and consists of an active zone 103, which may be formed as a quantum well or superlattice or multiple quantum well or quantum dot structure, is applied on a semiconductor substrate 102. This active zone is embedded in semiconductor barrier layers 104 (second conductivity type) and 105 (first conductivity type), which have a larger band gap than the active layer 103. The layer sequence 105, 103, 104 is adjoined by a cover layer 106 of the second conductivity type and a cover layer 107 with the first conductivity type, both of which have a lower refractive index than layers 103, 104 and 105. This component structure is connected to the substrate 102 with the first conductivity type via a buffer layer 108. Next to the substrate 102, a contact layer 109 is arranged between substrate and a cover layer 107 of the first conductivity type. Electrical connection can be made via a metal contact 110 lying on the surface of layer 106 or on a contact layer and a metal contact 111 arranged, for example, on the rear of the substrate 102.

In accordance with the invention, the contact layer 109, which is arranged between the substrate 102 or the buffer layer 108 and the cover layer 107, is configured as a multilayer which, in particular, includes materials containing BeTe. The features of the contact structures according to the invention as indicated in the discussion of the refinements according to FIGS. 5A, 5B, 8, 11A and 11B and the associated figures are also features of the structure of layer 109.

Where the contact layer 109 is used between a p-conducting substrate 102 and a p-conducting cover layer 107 which, in particular, contains selenium or ZnSe, then the contact layer sequence 109 according to the invention is provided with the base layer containing ZnSe within the layer sequence of layer 109 facing the cover layer 107. The contact layer containing tellurium or BeTe faces the p-conducting substrate 102 or the buffer layer 108.

In a preferred refinement of the semiconductor body 101 in FIG. 15, the substrate 102 consists of p-conducting GaAs on which p-conducting GaAs or InGaAs buffer 108 is applied using MBE. The active zone 103 is between 500 Å and 15 Å wide and consists, for example, of BeZnCdSe, ZnCdSSe or a ZnSe/BeTe superlattice with a specific period of less than 100 Å, in which the emission wavelength of the laser or light-emitting diode can be adjusted through the choice of the individual layer thicknesses of ZnSe and BeTe. As the waveguide layers 104, 105 (thickness about 20 nm to 200 nm), it is possible to use BeZnSe or ZnSSe such that the lattice mismatch of the mixed crystal in layers 104 and 105 is less than 0.1% in relation to the substrate crystal. In layers 106 and 107, it is for example possible to use BeMgznSe or ZnMgSSe or a BeMgZnSe/BeTe, ZnMgSSe/ZnSe or a BeMgZnSe/ZnSe superlattice with a specific period, such that the lattice mismatch of the mixed crystal in layers 106 and 107 is less than 0.1% in relation to the substrate crystal. Plasma-activated nitrogen, for example, may be used for p-doping the layers 105, 107 and 109. The elements I, Cl, Br, or Al may, for example, be used as donors in layers 104 and 106. Layer 108 may, for example, be doped with n-type conductivity using Si. The metal contact 110 may consist of Ti/Pt/Au or Al, and contact 111 may for example consist of Au/Zn or In.

The description of the manner of the interface preparation according to the invention, and the nature of the individual layers in relation to the contact structures and components according to the invention with the aid of these illustrative embodiments is, of course, not intended to imply any limitation of the invention to these illustrative embodiments. Contact structures according to the invention may be formed in emitter, detector, active and passive components with multipole drive made of II-VI semiconductors on substrates made of II-VI and III-V and elemental semiconductors, for example ZnSe, CdZnTe, CdTe, GaAs, InAs, GaP, Si, Ge and the like. In this regard, a contact layer sequence according to the invention may be used to form an ohmic contact facing the surface, but also for electrical connection of a component to a conductive or nonconductive substrate. Contact structures according to the invention can also be used for the junction of II-VI semiconductor layers based on CdTe, CdSe, MnTe, MgTe, ZnTe, BeTe, ZnS, BeS, BeSe with layers containing ZnSe, ZnO, SrSe, BaSe, SrTe, BaTe, SrS and BaS.

We claim:

1. A II-VI semiconductor component, which comprises a layer sequence including a semiconductor layer containing BeTe and a semiconductor layer containing Se and forming a junction therebetween with an interface, wherein said interface between said semiconductor layer containing BeTe and said semiconductor layer containing Se within said layer sequence is prepared such that a Be—Se bond configuration is formed.

2. The II-VI semiconductor component according to claim 1, which comprises a potential barrier for holes of less than 0.4 eV.

3. The II-VI semiconductor component according to claim 1, which comprises a junction layer formed of an alloy with graded variation in composition disposed between said semiconductor layer containing Se and said semiconductor layer containing BeTe.

4. The II-VI semiconductor component according to claim 3, wherein said graded alloy is a digital graded alloy.

5. The II-VI semiconductor component according to claim 4, which further comprises at least one layer delta-doped with acceptors inserted between said semiconductor layer containing Se and said digital graded alloy.

6. The II-VI semiconductor component according to claim 4, which further comprises at least one layer delta-doped with donors disposed between said digital graded alloy and said semiconductor layer containing BeTe.

7. The II-VI semiconductor component according to claim 3, which further comprises at least one layer delta-doped with acceptors inserted between said layer containing Se and said graded alloy.

8. The II-VI semiconductor component according to claim 3, which further comprises at least one layer delta-doped with donors disposed between said graded alloy and said semiconductor layer containing BeTe.

9. The II-VI semiconductor component according to claim 1, which further comprises at least one layer doped with acceptors inserted in said semiconductor layer containing Se, at a given distance from said interface between said semiconductor layer containing BeTe and said semiconductor layer containing Se.

10. The II-VI semiconductor component according to claim 1, which further comprises at least one layer doped with acceptors inserted in said semiconductor layer containing BeTe, at a given distance from said interface between said semiconductor layer containing BeTe and said semiconductor layer containing Se.

11. A process for producing the II-VI semiconductor component according to claim 1, which comprises epitaxially growing the layer containing Se and ending or starting the epitaxial growth with Se coverage.

12. The process according to claim 11, which comprises applying an Se flux to a surface of the layer containing Se before the growth of the layer containing BeTe.

13. The process according to claim 11 which comprises preparing the Be—Se configuration by growing the layer containing Se under excess Se.

14. A process for producing the II-VI semiconductor component according to claim 1, which comprises epitaxially growing the layer containing Se under Se-rich conditions.

15. The process according to claim 14, which comprises applying an Se flux to a surface of the layer containing Se before the growth of the layer containing BeTe.

16. The process according to claim 14, which comprises preparing the Be—Se configuration by growing the layer containing Se under excess Se.

17. A II-VI semiconductor component, which comprises:
a layer sequence including a semiconductor layer containing BeTe and a semiconductor layer containing Se and forming a junction therebetween with an interface; and
a potential barrier for holes of less than 1.2 ev, said potential barrier located between said semiconductor layer containing BeTe and said semiconductor layer containing Se;
wherein said interface between said semiconductor layer containing BeTe and said semiconductor layer containing Se within said layer sequence is prepared such that a Be—Se bond configuration is formed.

* * * * *

UNITED STATES PATENT AND TRADEMARK OFFICE
CERTIFICATE OF CORRECTION

PATENT NO. : 6,372,536 B1
DATED : April 16, 2002
INVENTOR(S) : Frank Fischer et al.

It is certified that error appears in the above-identified patent and that said Letters Patent is hereby corrected as shown below:

<u>Title page,</u>
Item [75], should read as follows:

-- Frank Fischer, Würzburg; Andreas Waag, Würzburg; Thierry Baron, Gerbrunn; Gottfried Landwehr, Würzburg; Thomas Litz, Gomaringen; Gunter Reuscher, Würzburg; Markus Keim, Ansbach; Ulrich Zehnder, Würzburg; Hans-Peter Steinrück, Erlangen; Mario Nagelstrasser, Wettstetten; Hans-Jürgen Lugauer, Gerbrunn all of (DE). --

Signed and Sealed this

Thirteenth Day of August, 2002

*Attest:*

*Attesting Officer*

JAMES E. ROGAN
*Director of the United States Patent and Trademark Office*